(12) United States Patent
Kumar et al.

(10) Patent No.: US 7,164,154 B2
(45) Date of Patent: Jan. 16, 2007

(54) GATE WIRING LAYOUT FOR SILICON-CARBIDE-BASED JUNCTION FIELD EFFECT TRANSISTOR

(75) Inventors: Rajesh Kumar, Nagoya (JP); Yuichi Takeuchi, Obu (JP); Mitsuhiro Kataoka, Nisshin (JP); Suhail Rashid Jeremy, Cambridge (GB); Andrei Mihaila, Cambridge (GB); Florin Udrea, Cambridge (GB)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 10/995,566

(22) Filed: Nov. 24, 2004

(65) Prior Publication Data

US 2005/0145852 A1 Jul. 7, 2005

(30) Foreign Application Priority Data

Nov. 28, 2003 (JP) .............................. 2003-399931

(51) Int. Cl.
*H01L 29/15* (2006.01)
(52) U.S. Cl. .................. 257/77; 257/264; 257/E29.243
(58) Field of Classification Search ................ 257/134, 257/135, 136, 256, 263, 264, 268
See application file for complete search history.

(56) References Cited

U.S. PATENT DOCUMENTS 6,853,006 B1 * 2/2005 Kataoka et al. ............... 257/77

7,005,678 B1 * 2/2006 Kumar et al. ................. 257/77

FOREIGN PATENT DOCUMENTS

| JP | 2003-068761 | * | 3/2003 |
| JP | A-2003-68761 | | 3/2003 |
| JP | A-2003-188380 | | 7/2003 |

* cited by examiner

*Primary Examiner*—Eddie Lee
*Assistant Examiner*—Andrew O. Arena
(74) *Attorney, Agent, or Firm*—Posz Law Group, PLC

(57) ABSTRACT

A silicon carbide semiconductor device includes: a semiconductor substrate including first and second gate layers, a channel layer, a source layer, and a trench; a gate wiring having a first portion and a plurality of second portions; and a source wiring having a third portion and a plurality of fourth portions. The trench extends in a predetermined extending direction. The first portion connects to the first gate layer in the trench, and extends to the extending direction. The second portions protrude perpendicularly to be a comb shape. The third portion extends to the extending direction. The fourth portions protrude perpendicularly to be a comb shape, and electrically connect to the source layer. Each of the second portions connects to the second gate layer through a contact hole.

14 Claims, 18 Drawing Sheets

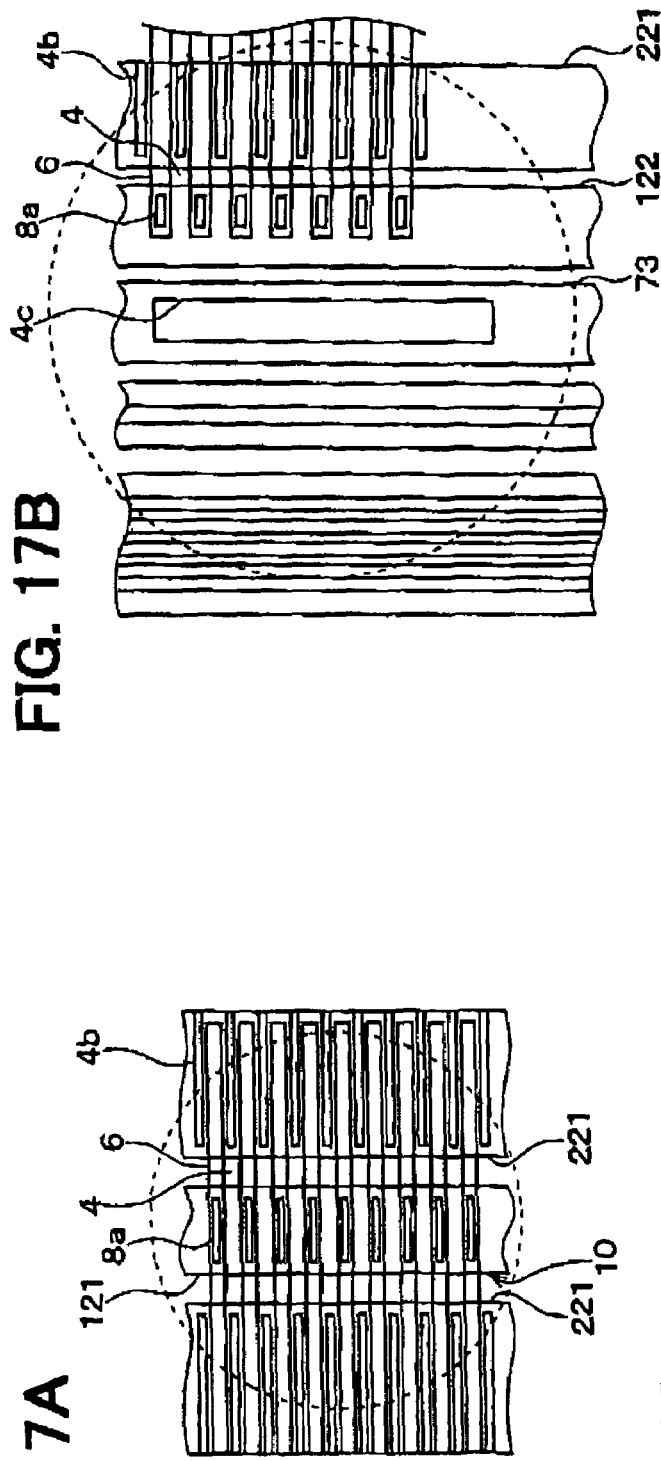
FIG. 17B
FIG. 17A
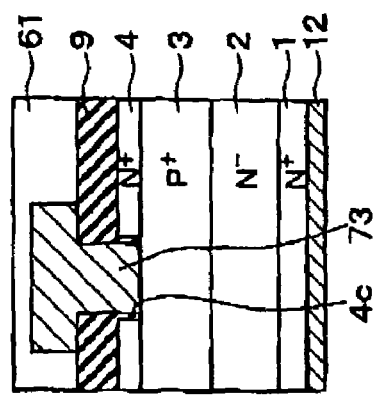
FIG. 17D
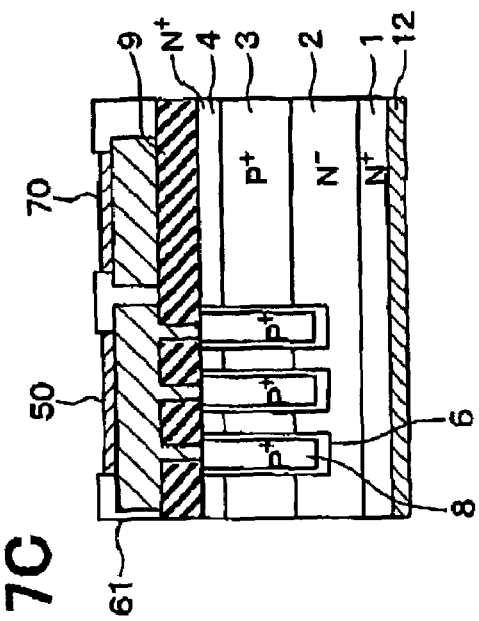
FIG. 17C

US 7,164,154 B2

GATE WIRING LAYOUT FOR SILICON-CARBIDE-BASED JUNCTION FIELD EFFECT TRANSISTOR

CROSS REFERENCE TO RELATED APPLICATION

This application is based on Japanese Patent Application No. 2003-399931 filed on Nov. 28, 2003, the disclosure of which is incorporated herein by reference.

FIELD OF THE INVENTION

The present invention relates to a silicon carbide semiconductor device.

BACKGROUND OF THE INVENTION

A silicon carbide semiconductor device having a J-FET (i.e., a junction field effect transistor) formed therein by the use of a silicon carbide semiconductor substrate has been proposed. The device is disclosed, for example, in Japanese Patent Application Publication No. 2003-068761-A. The sectional construction of this silicon carbide semiconductor device is shown in FIG. 18.

In this silicon carbide semiconductor device, a substrate J6 is used in which an $N^-$ type drift layer J2, a $P^+$ type first gate layer J3, and an $N^+$ type source layer J5 are formed in sequence on the surface of an $N^+$ type substrate J1. The silicon carbide semiconductor device has a construction in which a trench J7 passing through the $N^+$ type source layer J5 and the $P^+$ type first gate layer J3 is formed in the substrate J6 and in which an $N^-$ type channel layer J8 and a $P^+$ type second gate layer J9 are arranged in the trench J7.

With this structure, a normally-off type J-FET is constructed in which the $N^-$ type channel layer J8 is sandwiched by the $P^+$ type first and second gate layers J3 and J9, whereby the $N^-$ type channel layer J7 side is completely depleted by a depletion layer extending from the $P^+$ type first and second gate layers J3 and J9 even in a state where voltage is not applied across the $P^+$ type first and second gate layers J3 and J9.

On the other hand, various researches on a semiconductor device technology have been conducted so as to reduce the size of a cell. In order to reduce the size of a cell, also in the silicon carbide semiconductor device, the layout construction of a wiring structure becomes important.

For example, a vertical power MOSFET having a sectional construction shown in FIG. 19 has been known. The MOSFET is disclosed, for example, in Japanese Patent Application Publication No. 2003-188380. In this vertical power MOSFET, a trench J13 is formed in such a way as to pass through a P type base layer J11 and a source region J12, and a gate electrode J15 is formed in the trench J13 via an oxide film J14. The vertical power MOSFET has a construction in which a gate wiring electrically connected to the gate electrode J15 and a source wiring J16 electrically connected to both of the source region J12 and the P type base layer J11 are electrically separated from each other.

In this construction, the $N^+$ type source layer J12 and the P type base layer J11 provide common electrodes, so that the layout of the source wiring is not so difficult and the size of a cell can be easily reduced.

However, in the silicon carbide semiconductor device provided with the J-FET of the structure described above, both of the source wiring electrically connected to the $N^+$ type source layer and a gate wiring electrically connected to the $P^+$ type first gate layer and the $P^+$ type second gate layer are disposed on the main surface side of the substrate. For this reason, the layout of the source wiring is limited by the gate wiring to increase difficulty in layout. Depending on the layout of the source wiring and the gate wiring, this leads to enlarging the size of a cell, which is not preferable.

SUMMARY OF THE INVENTION

In view of the above-described problem, it is an object of the present invention to provide a silicon carbide semiconductor device, a cell size of which is comparatively small.

A silicon carbide semiconductor device includes: a semiconductor substrate including first and second gate layers, a channel layer, a source layer, and a trench; a gate wiring having a first portion and a plurality of second portions; and a source wiring having a third portion and a plurality of fourth portions. The source layer is disposed on the second gate layer. The trench penetrates both of the source layer and the second gate layer, and extends in a predetermined extending direction on a principal surface of the semiconductor substrate. The first gate layer is disposed in the trench through the channel layer, and extends in parallel to the extending direction. The gate and source wirings are disposed on the principal surface of the semiconductor substrate. The first portion is disposed on and electrically connects to the first gate layer, and extends in parallel to the extending direction. The second portions protrude perpendicularly to the extending direction from a side of the first portion to be a comb shape. The third portion is disposed on the source layer, and extends in parallel to the extending direction. The fourth portions protrude perpendicularly to the extending direction from a side of the third portion to be a comb shape, and electrically connect to the source layer. The second portions and the fourth portions are disposed alternately to face each other. Each of the second portions connects to the second gate layer through a contact hole disposed in the source layer.

In the above device, the second portions of the gate wiring and the fourth portions of the source wiring are disposed alternately so that a cell size of the device is reduced. Thus, the dimensions of the device are comparatively small.

Preferably, the device further includes a drain electrode. The semiconductor substrate further includes a substrate and a first semiconductor layer. The drain electrode is disposed on a bottom surface of the substrate, which is opposite to the principal surface of the semiconductor substrate. The substrate, the first semiconductor layer, the second gate layer, and the source layer are laminated in this order. The semiconductor substrate has a first conductive type and is made of silicon carbide. The first semiconductor layer has the first conductive type and is made of silicon carbide with an impurity concentration lower than the substrate. The second gate layer has a second conductive type and is made of silicon carbide. The source layer has the first conductive type and is made of silicon carbide. The trench reaches the first semiconductor layer through the source layer and the second gate layer. The channel layer has the first conductive type and is disposed on an inner wall of the trench. The first gate layer has the second conductive type and is disposed in the trench through the channel layer. More preferably, a part of the second portion is disposed in the contact hole through an insulation film, and the contact hole is disposed under the second portion. Furthermore preferably, the insulation film in the contact hole contacts the first gate layer so that a cross section of the second portion in the contact hole becomes larger. In this case, the contact resistance between the gate wiring and the first gate layer become smaller.

Further, a silicon carbide semiconductor device includes: a semiconductor substrate including first and second gate layers, a channel layer, a source layer, and a trench; a gate wiring having a first portion and a plurality of second portions; a gate pad connecting to the second gate layer electrically; and a source wiring having a third portion and a plurality of fourth portions. The source layer is disposed on the second gate layer. The trench penetrates both of the source layer and the second gate layer, and extends in a predetermined extending direction on a principal surface of the semiconductor substrate. The first gate layer is disposed in the trench through the channel layer, and extends in parallel to the extending direction. The gate and source wirings are disposed on the principal surface of the semiconductor substrate. The first portion extends perpendicularly to the extending direction. The second portions protrude in parallel to the extending direction from a side of the first portion to be a comb shape, and are disposed on and electrically connect to the first gate layer. The third portion extends perpendicularly to the extending direction. The fourth portions protrude in parallel to the extending direction from a side of the third portion to be a comb shape, and are disposed on and electrically connect to the source layer. The second portions and the fourth portions are disposed alternately to face each other. The gate pad connects to the second gate layer through a contact hole disposed in the source layer.

In the above device, the second portions of the gate wiring and the fourth portions of the source wiring are disposed alternately so that a cell size of the device is reduced. Thus, the dimensions of the device are comparatively small.

Preferably, a part of the gate pad is disposed in the contact hole, which is disposed on a part of the principal surface of the semiconductor substrate, wherein the part is apart from the trench. More preferably, the fourth portion is made of a nickel film. In this case, the cell in the device can be high density.

Further, a silicon carbide semiconductor device includes: a semiconductor substrate including first and second gate layers, a channel layer, a source layer, and a trench; a gate wiring having a first portion and a plurality of second portions; and a source wiring having a third portion and a plurality of fourth portions. The source layer is disposed on the second gate layer. The trench penetrates both of the source layer and the second gate layer, and extends in a predetermined extending direction on a principal surface of the semiconductor substrate. The first gate layer is disposed in the trench through the channel layer, and extends in parallel to the extending direction. The gate and source wirings are disposed on the principal surface of the semiconductor substrate. The first portion extends perpendicularly to the extending direction. The second portions protrude in parallel to the extending direction from a side of the first portion to be a comb shape, and are disposed on and electrically connect to the first gate layer. The third portion extends perpendicularly to the extending direction. The fourth portions protrude in parallel to the extending direction from a side of the third portion to be a comb shape, and are disposed on and electrically connect to the source layer. The second portions and the fourth portions are disposed alternately to face each other. The first portion connects to the second gate layer through a contact hole disposed in the source layer.

In the above device, the second portions of the gate wiring and the fourth portions of the source wiring are disposed alternately so that a cell size of the device is reduced. Thus, the dimensions of the device are comparatively small.

Preferably, a part of the first portion is disposed in the contact hole, and the contact hole is disposed under the first portion.

Further, a silicon carbide semiconductor device comprising: a semiconductor substrate including first and second gate layers, a channel layer, a source layer, and a trench; a gate wiring having a plurality of first portions and a plurality of second portions; and a source wiring having a plurality of third portions and a plurality of fourth portions. The source layer is disposed on the second gate layer. The trench penetrates both of the source layer and the second gate layer, and extends in a predetermined extending direction on a principal surface of the semiconductor substrate. The first gate layer is disposed in the trench through the channel layer, and extends in parallel to the extending direction. The gate and source wirings are disposed on the principal surface of the semiconductor substrate. The first portions are disposed on and electrically connect to the first gate layer, and extend in parallel to the extending direction. The second portions protrude perpendicularly to the extending direction from both sides of the first portions to be a mesh shape. The third portions are disposed on the source layer, and extend in parallel to the extending direction. The fourth portions protrude perpendicularly to the extending direction from both sides of the third portions to be a mesh shape, and electrically connect to the source layer. The first portions and the third portions are disposed alternately to face each other. The second portions and the fourth portions are disposed alternately to face each other. Each of the second portions connects to the second gate layer through a contact hole disposed in the source layer.

In the above device, the gate wiring and the source wiring are disposed alternately so that a cell size of the device is reduced. Thus, the dimensions of the device are comparatively small.

Further, a silicon carbide semiconductor device includes: a semiconductor substrate including first and second gate layers, a channel layer, a source layer, and a trench; a gate wiring having a first portion and a plurality of second portions; and a source wiring. The source layer is disposed on the second gate layer. The trench penetrates both of the source layer and the second gate layer, and extends in a predetermined extending direction on a principal surface of the semiconductor substrate. The first gate layer is disposed in the trench through the channel layer, and extends in parallel to the extending direction. The gate and source wirings are disposed on the principal surface of the semiconductor substrate. The first portion is disposed on and electrically connects to the first gate layer, and extends in parallel to the extending direction. The second portions protrude perpendicularly to the extending direction from a side of the first portion to be a comb shape. The source wiring is disposed on the source layer, extends in parallel to the extending direction, and electrically connects to the source layer. The semiconductor substrate further includes a concavity, which is disposed under the second portions to expose a surface of the second gate layer. Each of the second portions connects to the second gate layer exposed on a bottom of the concavity.

In the above device, the second portions of the gate wiring are disposed appropriately so that a cell size of the device is reduced. Thus, the dimensions of the device are comparatively small.

Further, a silicon carbide semiconductor device includes: a semiconductor substrate including first and second gate layers, a channel layer, a source layer, and a trench; a gate wiring having a first portion and a plurality of second portions; and a source wiring. The source layer is disposed on the second gate layer. The trench penetrates both of the source layer and the second gate layer, and extends in a predetermined extending direction on a principal surface of the semiconductor substrate. The first gate layer is disposed in the trench through the channel layer, and extends in parallel to the extending direction. The gate and source wirings are disposed on the principal surface of the semiconductor substrate. The first portion is disposed on and electrically connects to the first gate layer, and extends in parallel to the extending direction. The second portions protrude perpendicularly to the extending direction from a side of the first portion to be a comb shape. The source wiring is disposed on the source layer, extends in parallel to the extending direction, and electrically connects to the source layer. The semiconductor substrate further includes a concavity, which is disposed under the second portions and a part of the first portion to expose a surface of the second gate layer. The part of the first portion is disposed at a cross portion between two second portions, which are disposed on both sides of the first portion. Each of the second portions connects to the second gate layer exposed on a bottom of the concavity.

In the above device, the second portions of the gate wiring are disposed appropriately so that a cell size of the device is reduced. Thus, the dimensions of the device are comparatively small.

Further, a silicon carbide semiconductor device includes: a semiconductor substrate including first and second gate layers, a channel layer, a source layer, an interlayer, and a trench; a gate wiring; and a source wiring. The source layer, the interlayer and the second gate layer are laminated in this order. The trench penetrates both of the source layer, the interlayer and the second gate layer, and extends in a predetermined extending direction on a principal surface of the semiconductor substrate. The first gate layer is disposed in the trench through the channel layer, and extends in parallel to the extending direction. The gate and source wirings are disposed on the principal surface of the semiconductor substrate. The gate wiring is disposed on and electrically connects to the first gate layer, and extends in parallel to the extending direction. The source wiring is disposed on the source layer, extends in parallel to the extending direction, and electrically connects to the source layer. The interlayer connects between the first and second gate layers electrically.

In the above device, a cell size of the device is reduced so that the dimensions of the device are comparatively small.

Preferably, the gate wiring includes a first portion and a plurality of second portions. The first portion is disposed on and electrically connects to the first gate layer, and extends in parallel to the extending direction. The second portions protrude perpendicularly to the extending direction from a side of the first portion to be a comb shape. The semiconductor substrate further includes a concavity, which is disposed under the second portions to expose a surface of the interlayer. Each of the second portions connects to the second gate layer through the interlayer exposed on a bottom of the concavity.

Further, a silicon carbide semiconductor device includes: a semiconductor substrate including first and second gate layers, a channel layer, a source layer, an interlayer, and a trench; a gate wiring including a gate line; and a source wiring including a source line. The source layer and the second gate layer are laminated in this order. The trench penetrates both of the source layer and the second gate layer, and extends in a predetermined extending direction on a principal surface of the semiconductor substrate. The first gate layer is disposed in the trench through the channel layer, and extends in parallel to the extending direction. The gate and source wirings are disposed on the principal surface of the semiconductor substrate. The gate line extends perpendicularly to the extending direction. The source line extends perpendicularly to the extending direction, and is disposed on and electrically connects to the source layer. The interlayer is disposed between the first gate layer and the second gate layer in the channel layer so that the interlayer is disposed under and connects to the gate line. The interlayer connects between the first and second gate layers electrically.

In the above device, a cell size of the device is reduced so that the dimensions of the device are comparatively small.

Preferably, the gate wiring further includes an outer peripheral line disposed on an outer periphery of the semiconductor substrate. The outer peripheral line connects to the second gate layer through a contact hole disposed in the source layer. The contact hole is disposed under the outer peripheral line.

Further, a silicon carbide semiconductor device includes: a semiconductor substrate including first and second gate layers, a channel layer, a source layer, and a trench; a first gate wiring connecting to the first gate layer electrically; a second gate wiring connecting to the second gate layer electrically; and a source wiring connecting to the source layer electrically. The source layer is disposed on the second gate layer. The trench penetrates both of the source layer and the second gate layer, and extends in a predetermined extending direction on a principal surface of the semiconductor substrate. The first gate layer is disposed in the trench through the channel layer, and extends in parallel to the extending direction. The gate and source wirings are disposed on the principal surface of the semiconductor substrate. The first gate wiring includes a first gate line, which extends perpendicularly to the extending direction, and is disposed on and electrically connects to the first gate layer. The second gate wiring includes an outer peripheral line disposed on an outer periphery of the semiconductor substrate. The source wiring includes a source line, which extends perpendicularly to the extending direction, and is disposed on and electrically connects to the source layer. The outer peripheral line connects to the second gate layer through a contact hole disposed in the source layer. The contact hole is disposed under the outer peripheral line.

In the above device, a cell size of the device is reduced so that the dimensions of the device are comparatively small.

BRIEF DESCRIPTION OF THE DRAWINGS

The above and other objects, features and advantages of the present invention will become more apparent from the following detailed description made with reference to the accompanying drawings. In the drawings:

FIG. 17A is a partially enlarged plan view showing a part XVIIA in FIG. 16, FIG. 17B is a partially enlarged plan view showing a part XVIIB in FIG. 16, FIG. 17C is a partially enlarged cross sectional view showing a part of the device taken along line XVIIC—XVIIC in FIG. 16, and FIG. 17D is a partially enlarged cross sectional view showing a part of the device taken along line XVIID—XVIID in FIG. 16;

DETAILED DESCRIPTION OF THE PREFERRED EMBODIMENTS (First Embodiment)

Figure 1:
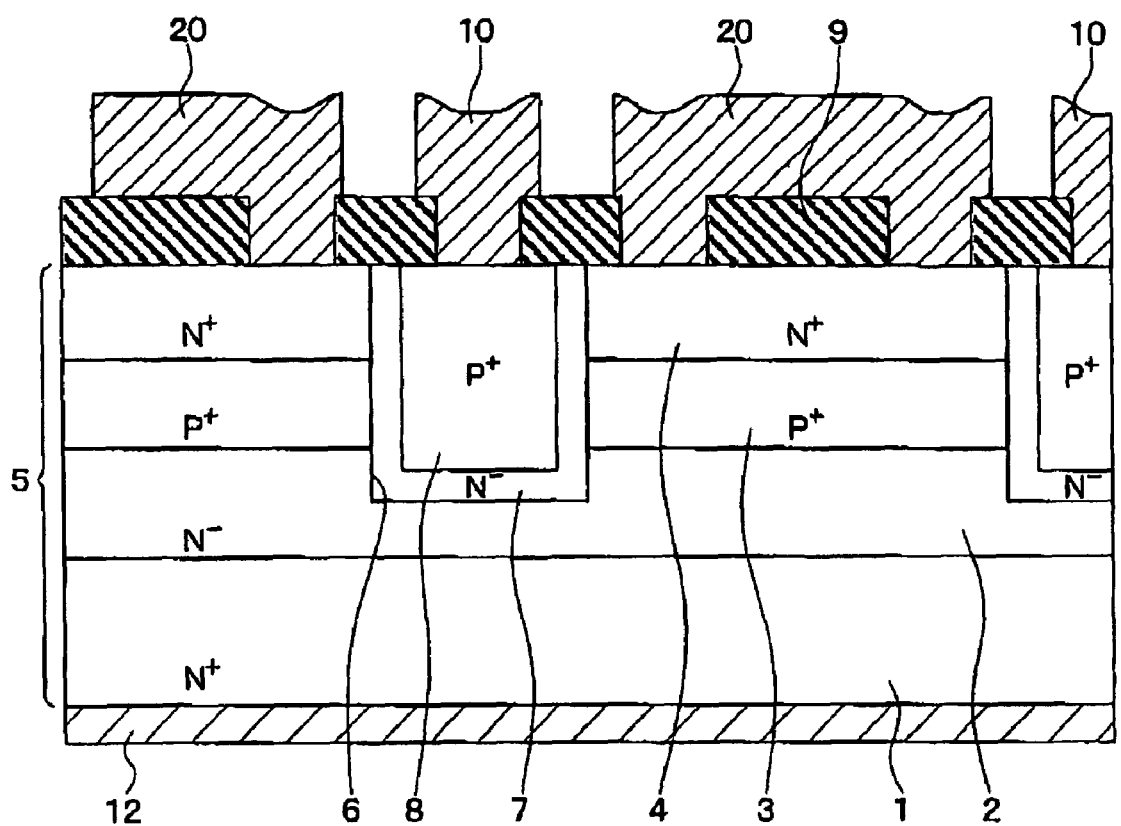
FIG. 1 is a cross sectional view showing a part of a silicon carbide semiconductor device according to a first embodiment of the present invention.

A silicon carbide semiconductor device will be described to which one embodiment of the invention is applied. In FIG. 1 is shown a sectional view of a silicon carbide semiconductor device in this embodiment. Hereafter, the construction of the silicon carbide semiconductor device will be described based on this drawing.

As shown in FIG. 1, the silicon carbide semiconductor device is provided with an $N^+$ type substrate (substrate) 1 having an impurity concentration of, for example, $1 \times 10^{19}$ $cm^{-3}$ or more, an $N^-$ type drift layer (first semiconductor layer) 2 having an impurity concentration of, for example, from $1 \times 10^{15}$ $cm^{-3}$ to $5 \times 10^{16}$ $cm^{-3}$, a $P^+$ type layer (second semiconductor layer) 3 having an impurity concentration of, for example, from $1 \times 10^{18}$ $cm^{-3}$ to $5 \times 10^{19}$ $cm^{-3}$, and an $N^+$ type layer (third semiconductor layer) 4 having an impurity concentration of, for example, from $1 \times 10^{18}$ $cm^{-3}$ to $5 \times 10^{20}$ $cm^{-1}$. These $N^+$ type substrate 1, the $N^-$ type drift layer 2, the $P^+$ type layer 3, and the $N^+$ type layer 4 are constructed of silicon carbide and a semiconductor substrate 5 is constructed of these substrate and layers.

A cell part having many J-FETs is formed in the semiconductor substrate 5. FIG. 1 corresponds to a sectional view to show a portion of the cell part.

A trench 6 passing through the $N^+$ type layer 4 and the $P^+$ type layer 3 and reaching the $N^+$ type drift layer 2 is formed on the main surface side of the semiconductor substrate 5 in the cell part (region having J-FET formed therein). Although all of the trenches 6 are not shown in FIG. 1, in reality, these trenches 6 are formed in a state arranged at predetermined intervals at a plurality of positions. On the inner wall surface of each of the plurality of trenches 6 are sequentially formed an $N^-$ epitaxial layer 7 that becomes a channel layer having a thickness of, for example, 1 μm or less and an impurity concentration of, for example, from $5 \times 10^{15}$ $cm^{-3}$ to $5 \times 10^{16}$ $cm^{-3}$ and an $P^+$ type layer (fifth semiconductor layer) 8 having an impurity concentration of, for example, from $1 \times 10^{18}$ $cm^{-3}$ to $5 \times 10^{20}$ $cm^{-3}$.

In the J-FET, the first gate layer and the second gate layer are constructed of the $P^+$ type layers 3, 8 and a source layer is constructed of the $N^+$ type layer 4. A gate wiring 10 and a source wiring 20 are formed on the top of the semiconductor substrate via an interlayer insulation film 9 formed over the surface of the semiconductor substrate 5.

The gate wiring 10 is electrically connected to the $P^+$ type layer 8 forming the first gate layer and the $P^+$ type layer 3 forming the second gate layer. On the other hand, the source wiring 20 is electrically connected to the $N^+$ type layer 4 forming the source layer. This source wiring 20 is so constructed as to be electrically separated from the gate wiring 10 via the interlayer insulation film 9. The detailed layout construction of these gate wiring 10 and source wiring 20 will be described later.

A drain electrode 12 electrically connected to the $N^+$ type substrate 1 is formed on the bottom surface side of the semiconductor substrate 5. The cell part including the plurality of J-FETs is constructed by this construction. In this manner, a silicon carbide semiconductor device is provided with the cell part having the J-FETS.

Figure 2:
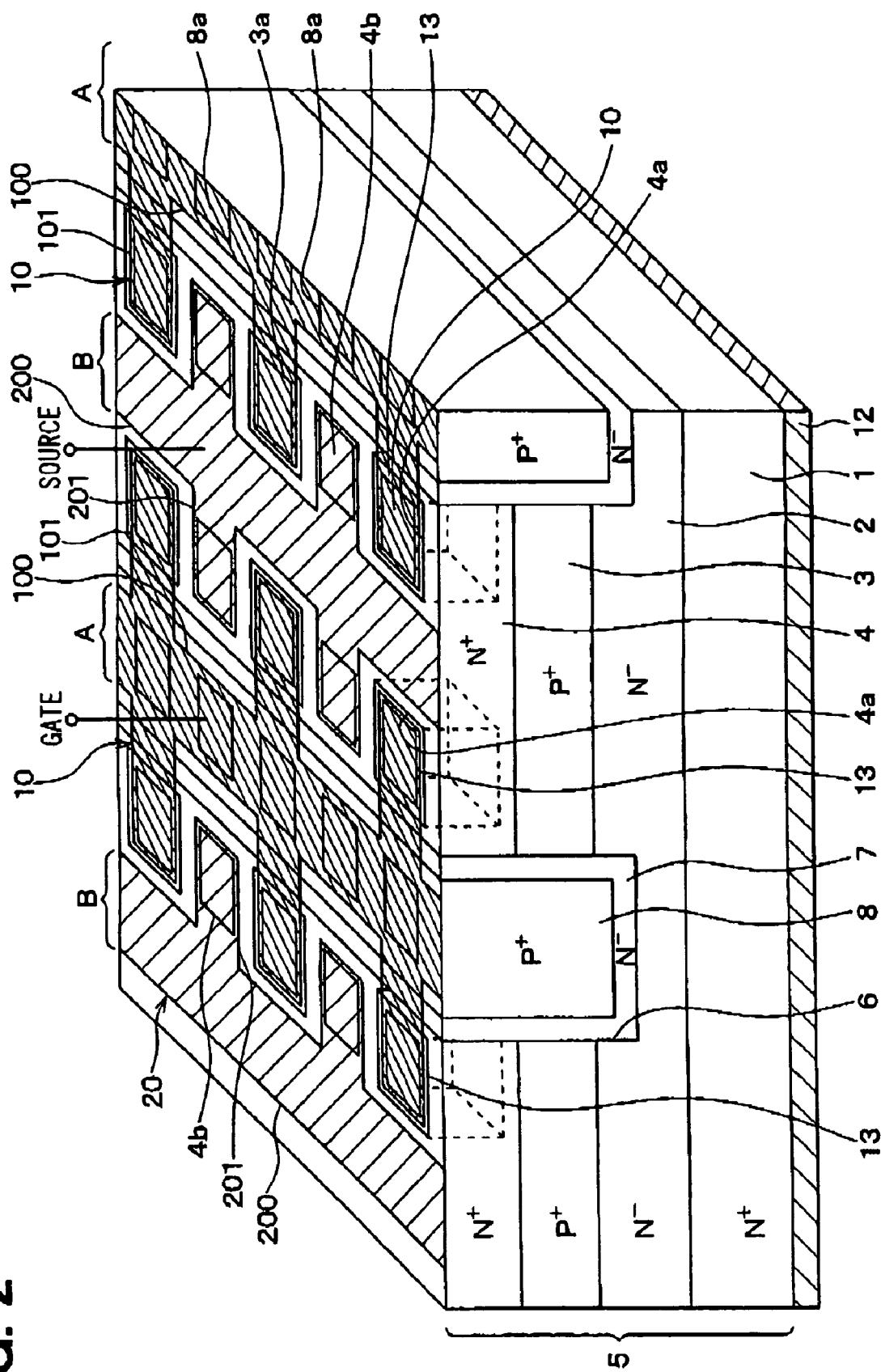
FIG. 2 is a schematic perspective view showing a part of the device according to the first embodiment.

Next, a partial sectional perspective layout of the silicon carbide semiconductor device shown in FIG. 1 is shown in FIG. 2. The layout construction of the gate wiring 10 and the source wiring 20 will be described based on this drawing. Here, a contact portion in contact with the gate wiring 10 of the $P^+$ type layer 3 forming the second source layer and a contact portion in contact with a source of the $N^+$ type layer 4 forming the source layer are shown in FIG. 2 in the manner simplified in number, but in reality the contact portions are formed at a plurality of positions of each cell.

The gate wiring 10, as shown in a region A in FIG. 2, is formed in such a way as to be put into contact with the surface of the $P^+$ type layer 8 forming the first gate layer and the surface of the $P^+$ type layer 8 forming the second gate layer. To be more specific, although not shown in FIG. 2, contact holes are formed in the interlayer insulation film 9 (see FIG. 1), and the gate wiring 10 and the P$^+$ type layer 8 are electrically connected to each other via these contact holes. Further, as shown by dotted lines in FIG. 2, contact holes 4a are formed also in the N$^+$ type source layer 4 by selective etching and the gate wiring 10 is buried in each of the contact holes 4a via an oxide film (insulation film) 13, thereby being electrically connected to the P$^+$ type layer 3.

This gate wiring 10 is constructed of a Ni film, which is a material capable of being in ohmic contact with a P$^+$ type semiconductor, and an alloy film laminated over the Ni film layer and made of Ni and Al.

As shown in the drawing, in the region where the plurality of J-FETs are formed of the cell part, the gate wiring 10 is constructed of a portion (first portion) 100 extended in the direction in which the trench 6 and the first gate layer 8 are extended, that is, in the direction of length of these and portions (second portions) 101 extended in a direction normal to the portion 100. The portions 101 are formed at a plurality of positions in the portion 100 and are so constructed as to be extended on both sides of the portion 100. Further, the portion 100 is constructed of a Ni film having a width of, for example, about 3 μm and an alloy film laminated over the Ni film and having a width of, for example, about 8 μm and made of Ni and Al, and the portion 101 is constructed only of, for example, a Ni film. The width of the Ni film is equal to that of the trench 6 and is set at, for example, about 3 μm. That is, a portion like the portion 100 where current passing through the respective P$^+$ type layers 8 is collected to increase a current density is constructed of not only the Ni film but also the wide alloy film, and a portion like the portion 101 connected to each P$^+$ type layer 8 is constructed of only the Ni film 103.

The portions 100, 101 of this construction are provided in each cell. A plurality of contact holes each having a size of, for example, 1 μm×1 μm are formed in the interlayer insulation film 9 (see FIG. 1) below the portions 100, 101. Each portion 100 is electrically connected to the P$^+$ type layer 8 at a contact portion 8a and each portion 101 is electrically connected to the P$^+$ type layer 3 at a contact portion 3a. In this manner, the P$^+$ type layer 8 forming the first gate layer and the P$^+$ type layer 3 forming the second gate layer of each cell are electrically connected to the outside through the gate wiring 10 and the electric potential of each gate layer can be controlled from the outside.

On the other hand, the source wiring 20, as shown in a region B in FIG. 2, is formed in such a way as to be put into contact with the surface of the N$^+$ type layer 4 forming the N$^+$ type source layer. This source region 10 is constructed of an alloy layer made of Ni and Al that is a material capable of being in ohmic contact with the N type layer.

As shown in FIG. 2, in the region where the plurality of J-FETS are formed of the cell part, the source wiring 20 is also constructed of a portion 200 extended in parallel to the direction of length of the trench 6 and the P$^+$ type layer 8 forming the first gate layer and portions 201 extended in a direction normal to the portion 200. The portions 201 are formed at a plurality of positions in the portion 200 and are constructed in such a way as to be extended on both sides of the portion 200 at the respective positions. However, the portion 201 is formed on the one side of the portion 200 at the outermost position of the cell part.

Further, both of the portion 200 and the portion 201 are constructed of an alloy film made of Ni and Al and having a width of, for example, about 8 μm. The portions 201 are arranged in such a way as to be embedded in the gap of the portions 101 in the gate wiring 10.

The portions 200, 201 constructed in this manner are provided in each cell. A plurality of contact holes each having a size of, for example, 2 μm×2 μm are formed in the interlayer insulation film 9 (see FIG. 1) below the respective portions 201 and each portion 201 is electrically connected to the N$^+$ type layer 4 at a contact portion 4b. In this manner, the N$^+$ type layer 4 forming the source layers of the respective cells is electrically connected to the outside through the source wiring 20.

In the silicon carbide semiconductor device constructed in this manner, the J-FET formed in the cell part is operated in a normally-off state. This operation is controlled by the voltage applied to the gate wiring 10 and a double gate driving is conducted as follows.

That is, the quantity of elongation of a depletion layer extending to the N$^-$ type epitaxial layer 7 from both of the P$^+$ type layers 3, 8, which become the first and second gate layers, is controlled based on the electric potential of the gate wiring 10. For example, when voltage is not applied to the gate wiring 10, the N$^-$ type epitaxial layer 7 is pinched off by the depletion layer extending from both of the P$^+$ type layers 3, 8. With this, the current passing between the source and the drain is cut off. When a normal bias is applied across the P$^+$ type layers 3, 8 and the N$^-$ type epitaxial layer 7, the quantity of elongation of the depletion layer extending to the N$^-$ type epitaxial layer 7 is reduced. With this, a channel region is set and current is passed between the source and the drain.

As described above, in this embodiment, the layout construction of the gate wiring 10 and the source wiring 20 has been shown in the double gate structure of controlling the electric potentials of the P$^+$ type layer 8 and the P$^+$ type layer 3 that become the first and second gate layers. According to this construction, a layout capable of preventing the cell from being enlarged in size can be constructed in the source wiring 20 and the gate wiring 10 in the silicon carbide semiconductor device having the J-FETs formed therein.

(Second Embodiment)

Figure 3:
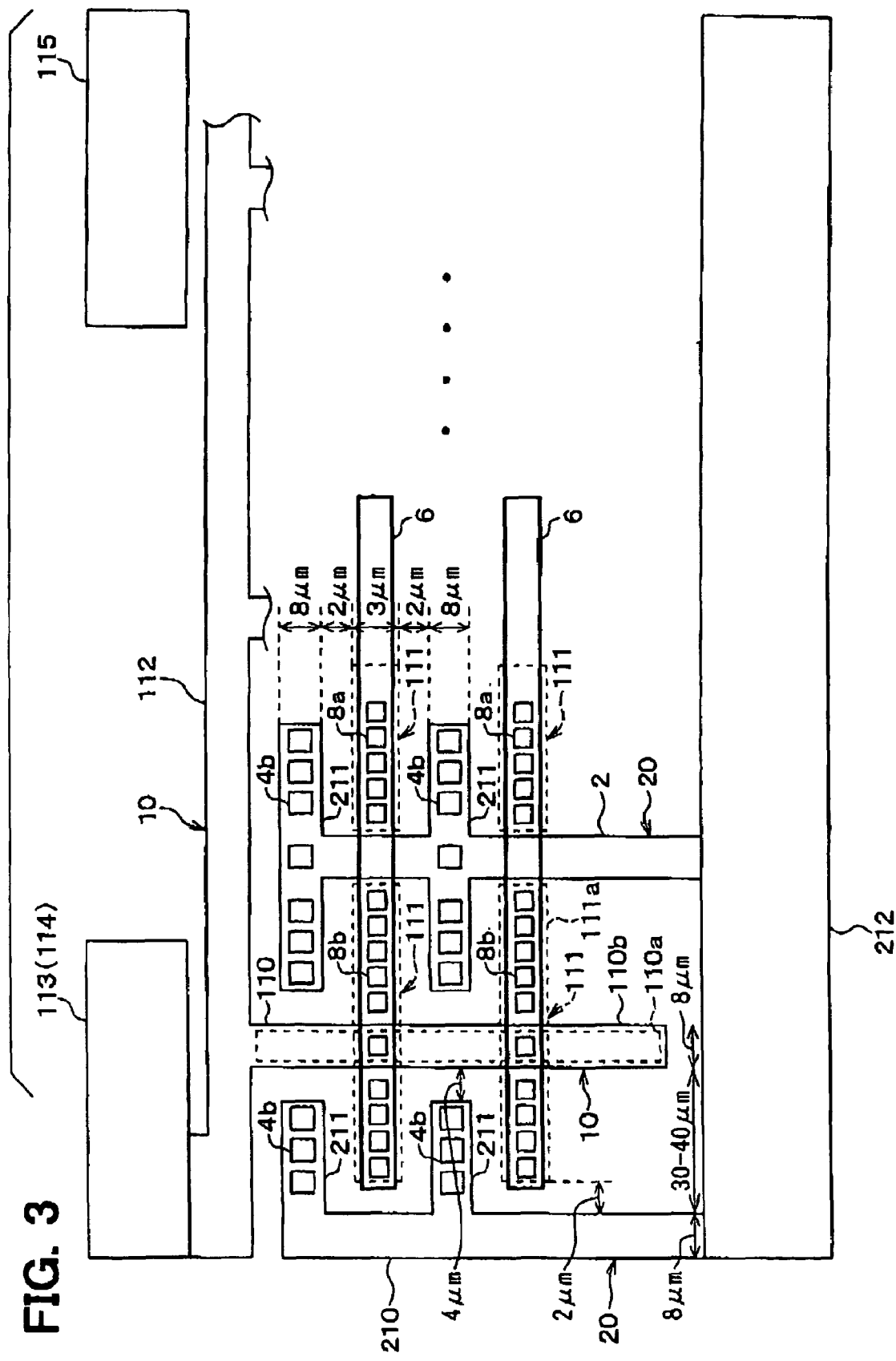
FIG. 3 is a schematic plan view showing a layout of a part of a silicon carbide semiconductor device according to a second embodiment of the present invention.

The second embodiment of the invention will be described. In FIG. 3 is shown a layout, when viewed from the top, of the silicon carbide semiconductor device in this embodiment. Further, the sizes of parts constructing the silicon carbide semiconductor device are shown in the drawing. The unit of these sizes is μm although not shown in the drawing.

This embodiment is different from the first embodiment and shows an optimum layout of the gate wiring and the source wiring in the case of adopting a double gate structure for independently controlling the electric potentials of the P$^+$ type layer 8 and the P$^+$ type layer 3 that become the first and second gate layers. As for the other portions, this embodiment is the same in the construction of the silicon carbide semiconductor device as the first embodiment, so that descriptions will be here provided only on the different parts.

As shown in FIG. 3, in the region where a plurality of J-FETs are formed of the cell part, the gate wiring 10 is constructed of a portion (first portion) 110 extended perpendicularly to a direction in which the trench 6 and the first gate layer 8 are extended, that is, in the direction of length of these and portions (second portions) 111 extended in a direction normal to the portion 110 (in parallel to the direction of length). The portions 111 are formed at a plurality of positions in the portion 110 and are constructed in such a way as to be extended on both sides of the portion 110. Further, the portion 110 is constructed of a Ni film 110a having a width of, for example, about 3 μm and an alloy film 110b laminated over the Ni film 110a and having a width of, for example, about 8 μm and made of Ni and Al. The portion 111 is constructed only of, for example, a Ni film 111a. The width of the Ni film 111a is equal to the width of the trench 6 and is set at, for example, about 3 μm. That is, a portion like the portion 110 where current passing through the respective P$^+$ type layers 8 is collected to increase a current density is constructed of not only the Ni film 110a but also the wide alloy film 110b and a portion like the portion 111 connected to the each P$^+$ type layer 8 is constructed only of the Ni film 111a.

The portions 110, 111 of this construction are provided in each cell. A plurality of contact holes each having a size of, for example, 1 μm×1 μm are formed in the interlayer insulation film 9 (see FIG. 1) below the portions 111 and each portion 111 is electrically connected to the P$^+$ type layer 8 at a contact portion 8b.

Further, outside the region where the plurality of J-FETs are formed, the gate wiring 10 is constructed of a common line 112 extended in parallel to the portion 111 and having a width of about 8 μm and a portion 114 formed over nearly the whole region below the first gate pad 113 and electrically connected to the common line 112. The portion 110 of the gate wiring 10 provided in each cell is so constructed as to be extended to one side in the direction of length of the trench 6 and the first gate layer 8 across the region where the plurality of J-FETs are formed and as to be connected to the common line 112. For this reason, the P$^+$ type layer 8 forming the first gate layer of each cell is electrically connected to the first gate pad 113 through the portions 110, 111, the common line 112, and the portion 114 of the gate wiring 10, and the electric potential of each gate layer can be controlled from the outside via the first gate pad 113.

On the other hand, outside the region where the plurality of J-FETs are formed, the second gate pad 115 electrically connected to the P$^+$ type layer 3 forming the second gate layer is provided on the same side as the first gate pad 113 is provided for each cell. To be more specific, in this region, a contact hole is formed in such a way as to pass through the source layer 4 and the P$^+$ type layer 3 is so constructed as to be put into direct contact with the second gate pad 115 via the contact hole.

In the region where the plurality of J-FETs are formed of the cell part, as shown in FIG. 3, the source wiring 20 is also constructed of a portion (third portion) 210 extended perpendicularly to the direction of length of the trench 6 and the first gate layer 8 and a portion (fourth portion) 211 extended perpendicularly to the portion 210. The portion 210 is formed at a position, for example, from 30 μm to 40 μm away from the portion 110 in the gate wiring 10. The portions 211 are so constructed as to be formed at a plurality of positions in the portion 210 and to be extended on both sides of the portion 210 at the respective positions. However, at the outermost position of the cell part, the portions 211 are provided only on the one side of the portion 210.

Further, both of the portion 210 and the portions 211 are constructed of an alloy film made of Ni and Al and having a width of, for example, about 8 μm. The portions 211 are so constructed as to be embedded in the gap between the portions 111 of the gate wiring 10. To be more specific, the distance from the portion 210 to the tip position of the portion 111 of the gate wiring 10 is set, for example, at about 2 μm. Further, the distance from the tip position of the portion 211 to the portion 110 of the gate wiring 10 is set, for example, at about 4 μm and the interval between the each portion 211 and the portion 111 of the gate wiring 10 is set at, for example, about 2 μm. The portions 210, 211 constructed in this manner are provided in each cell. A plurality of contact holes each having a size of, for example, 2 μm×2 μm are formed in the interlayer insulation film 9 (see FIG. 1) below the portions 211 and each portion 211 is electrically connected to the N$^+$ type layer 4 at a contact portion 4b.

Further, outside the region where the plurality of J-FETs are formed, the source wiring 20 is constructed of a source pad 212 extended in parallel to the portion 211. The portion 210 of the source wiring 20 provided in each cell is so constructed as to be extended to the opposite side in the direction of length of the trench 6 and the first gate layer 8 across the region where the plurality of J-FETs are formed, in other words, to the opposite side of the gate pad 113 and as to be connected to the source pad 212. For this reason, the N$^+$ type layer 4 forming the source layer of each cell is electrically connected to the source pad 212 through the portions 210, 211 in the source wiring and is electrically connected to the outside via the source pad 212.

As described above, in the double gate structure of independently controlling the electric potentials of the P$^+$ type layer 8 and the P$^+$ type layer 3 that become the first and second gate layers, the gate wiring 10 and the source wiring 20 can be laid out in the manner shown in this embodiment. With this, a layout capable of preventing the cell from being enlarged in size can be constructed in the source wiring 20 and the gate wiring 10 in the silicon carbide semiconductor device having the J-FETS formed therein.

(Third Embodiment)

Figure 4:
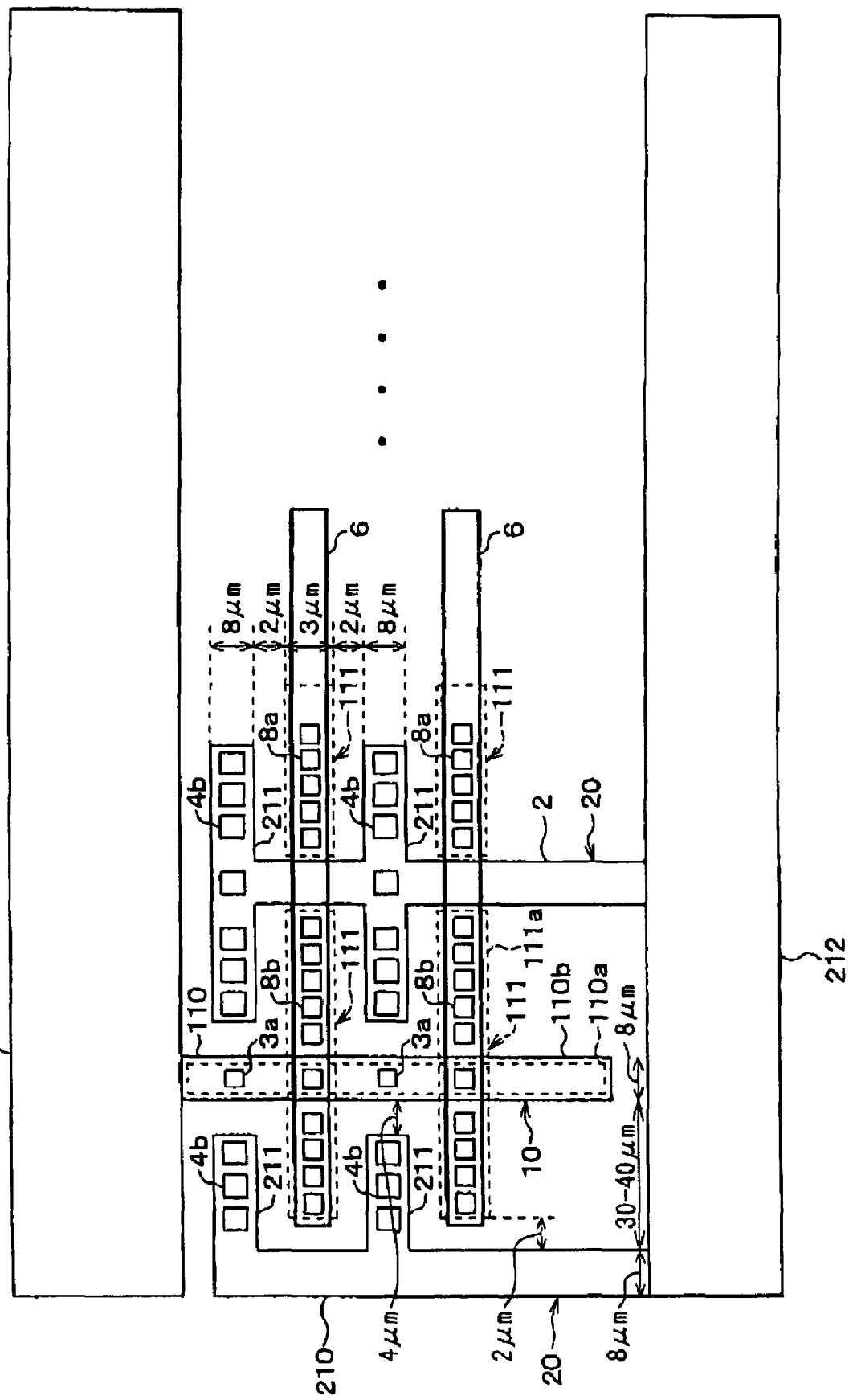
FIG. 4 is a schematic plan view showing a layout of a part of a silicon carbide semiconductor device according to a third embodiment of the present invention.

The third embodiment of the invention will be described. In FIG. 4 is shown a layout, when viewed from the top, of the silicon carbide semiconductor device in this embodiment. This embodiment shows an optimum layout of the gate wiring 10 and the source wiring 20 in the case of adopting the double gate structure for controlling the P$^+$ type layer 8 and the P$^+$ type layer 3 that become the first and second gate layers at the same electric potential, as is the case with the first embodiment. As for the other portions, this embodiment is the same in the construction of the silicon carbide semiconductor device as the first embodiment and is nearly the same also in the layout construction as the first embodiment, so that descriptions will be provided only on the different parts from the first embodiment.

As shown in FIG. 4, in this embodiment, a plurality of contact holes each having a size of 1 μm×1 μm are formed in the interlayer insulation layer 9 (see FIG. 1) and the N$^+$ type layer 4 below the portion 110 extended perpendicularly to the direction of length of the trench 6 and the first gate layer 8 of the gate wiring 10 and the each portion 110 is electrically connected to the P$^+$ type layer 3 at the contact portion 3a.

The whole region of the common line 112 shown in the third embodiment is made a gate pad 113.

In this manner, in the double gate structure for controlling the P$^+$ type layer 8 and the P$^+$ type layer 3 that become the first and second gate layers at the same electric potential, the gate wiring 10 and the source wiring 20 can be laid out in the manner of this embodiment. With this, a layout capable of preventing the cell from being enlarged in size can be constructed in the source wiring 20 and the gate wiring 10 in the silicon carbide semiconductor device having the J-FETs formed therein.

(Fourth Embodiment)

Figure 5:
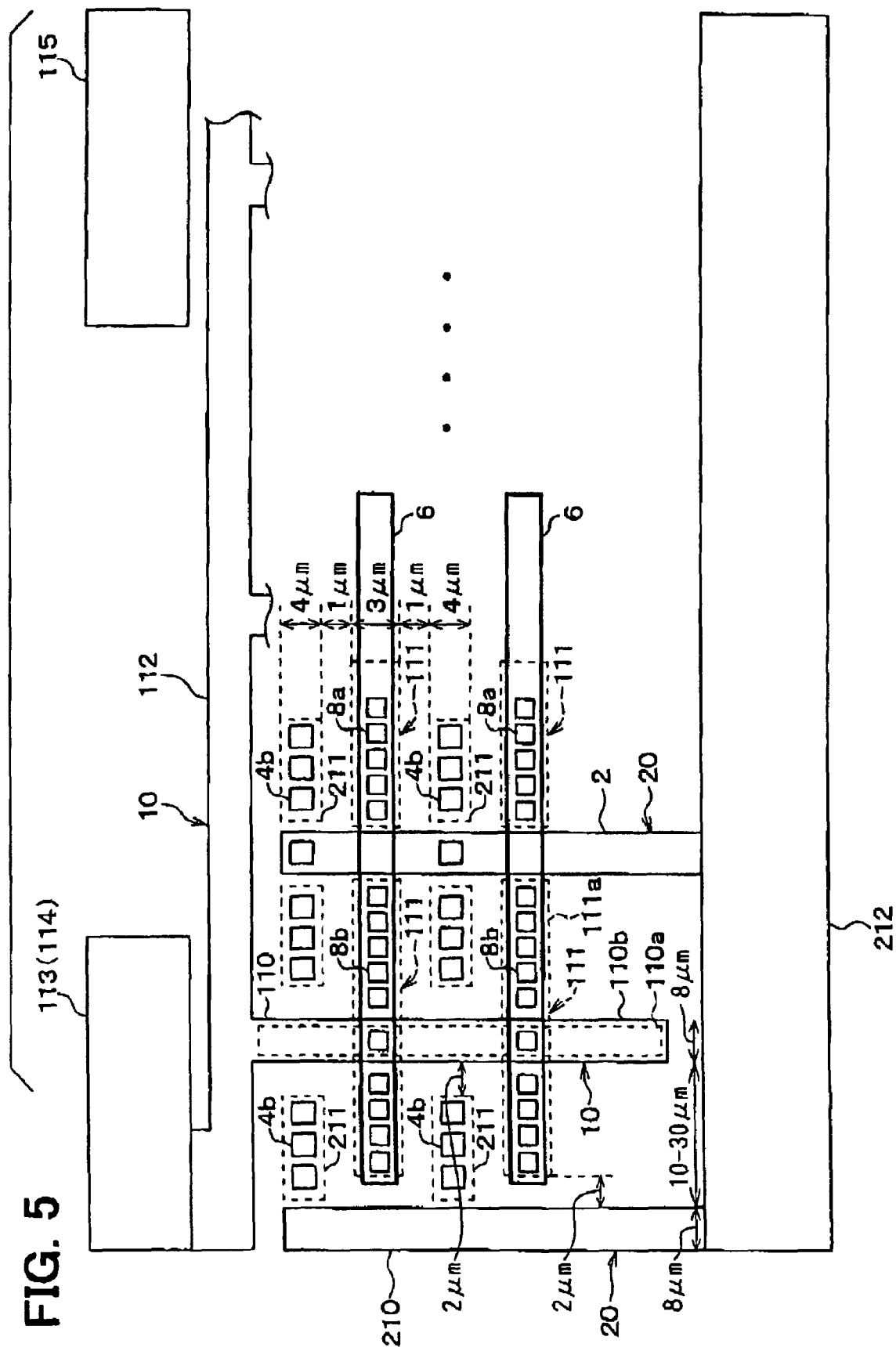
FIG. 5 is a schematic plan view showing a layout of a part of a silicon carbide semiconductor device according to a fourth embodiment of the present invention.

The fourth embodiment of the invention will be described. In FIG. 5 is shown a layout, when viewed from the top, of the silicon carbide semiconductor device in this embodiment. This embodiment, as is the case with the second embodiment, shows an optimum layout of the gate wiring 10 and the source wiring 20 in the case of adopting the double gate structure for controlling the P+ type layer 8 and the P+ type layer 3 that become the first and second gate layers at the same electric potential. As for the other portions, this embodiment is the same in the construction of the silicon carbide semiconductor device as the third embodiment, so that descriptions will be provided only on the different parts.

As shown in FIG. 5, in this embodiment, the portion 211 extended in parallel to the direction of length of the trench 6 and the first gate layer 8 is formed at a position of a shorter distance from the trench 6 than in the second embodiment, for example, at a position of 1 μm. Further, the distance from the tip of this portion 211 to the portion 110 in the gate wiring 10 is also shorter than in the second embodiment, for example, 2 μm. The portion 211 extending in parallel to the direction of length of the trench 6 and the first gate layer 8 of the source wiring 20 is constructed of a Ni film.

In this manner, in the case where the portion 211 in the source wiring 20 is formed at a position close to the portion 110 in the gate wiring 10, when the portion 211 is constructed of the Ni film, it is also possible to respond to a finer cell.

(Fifth Embodiment)

Figure 6:
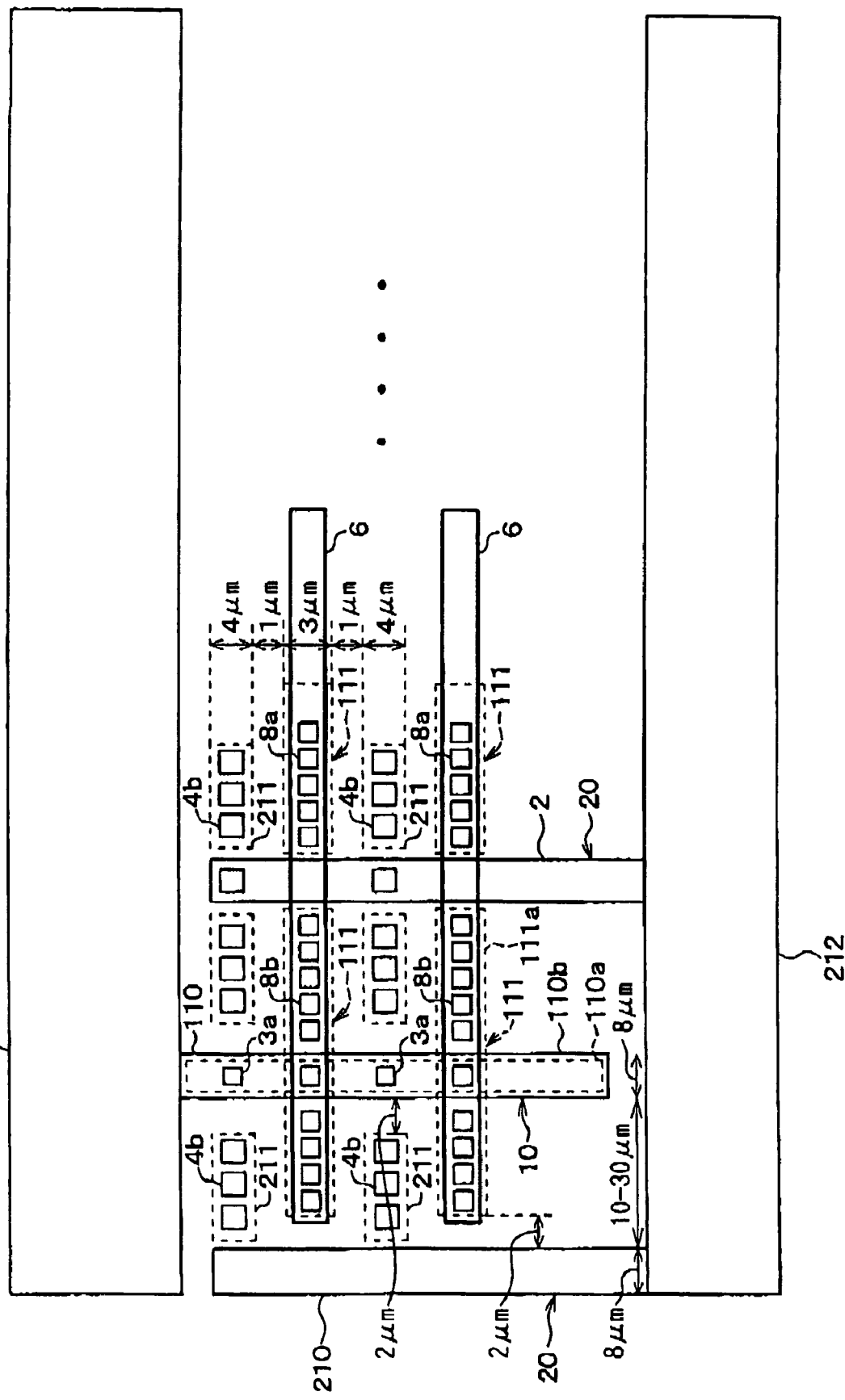
FIG. 6 is a schematic plan view showing a layout of a part of a silicon carbide semiconductor device according to a fifth embodiment of the present invention.

The fifth embodiment of the invention will be described. In FIG. 6 is shown a layout, when viewed from the top, of the silicon carbide semiconductor device in this embodiment. In this embodiment, as in the case with the third embodiment, the portion 211 of the source wiring 20 in the layout shown in the fourth embodiment is formed in the case of adopting the double gate structure for controlling the P+ type layer 8 and the P+ type layer 3 that become the first and second gate layers at the same electric potential.

In this manner, even when the portion 211 in the source wiring 20 is formed at a position close to the portion 110 in the gate wiring 10, each portion 110 in the gate wiring 10 is electrically connected to the P+ type layer 3 forming the second gate layer at the contact portion 3a.

(Sixth Embodiment)

Figure 7:
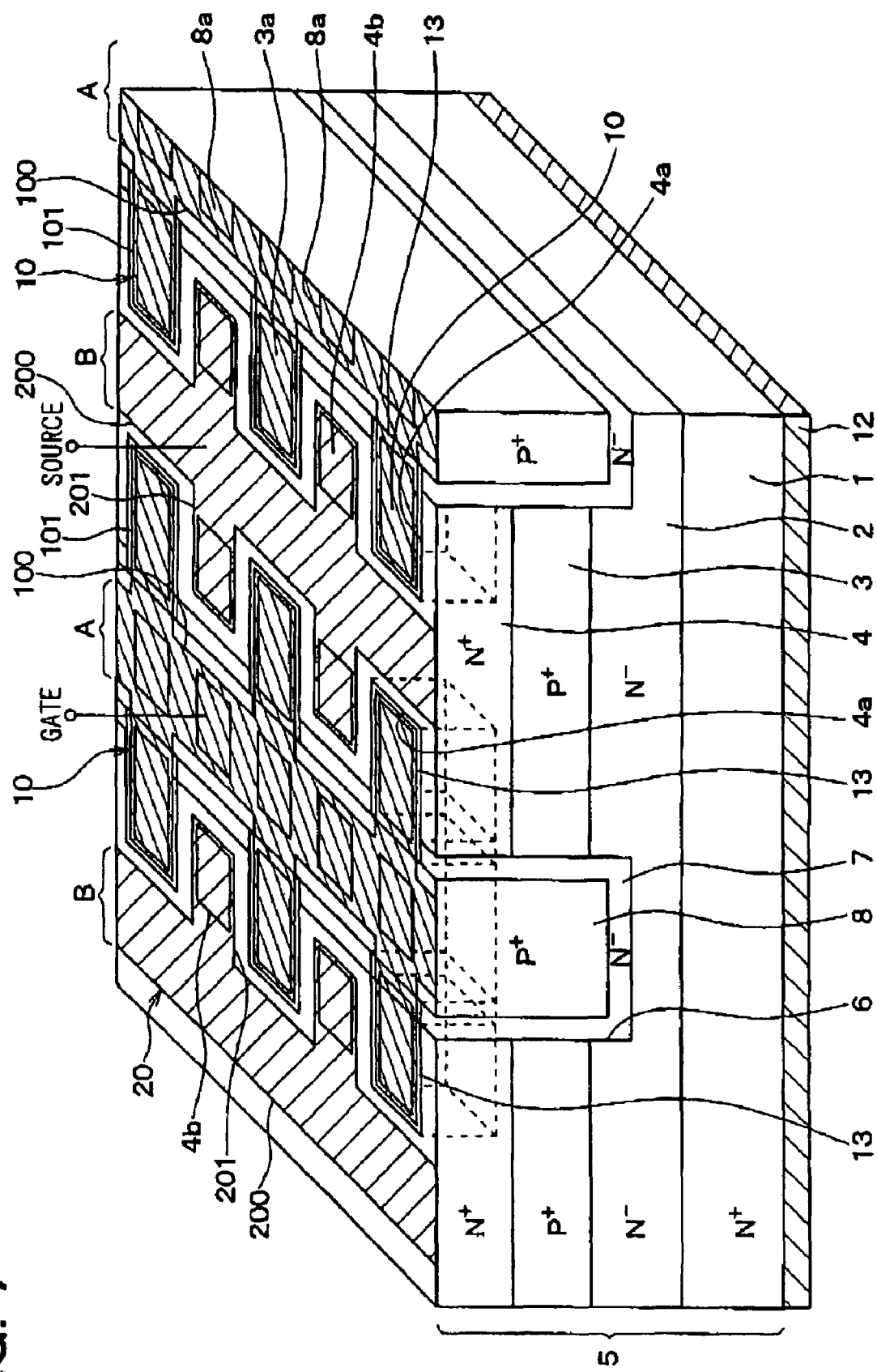
FIG. 7 is a schematic perspective view showing a part of a silicon carbide semiconductor device according to a sixth embodiment of the present invention.

The sixth embodiment of the invention will be described. In FIG. 7 is shown a partial sectional perspective layout of a silicon carbide semiconductor device in this embodiment.

This embodiment is different from the first embodiment in that the contact hole 4a formed in the N+ type layer 4 by selective etching is formed in such a way as to be removed to a portion below the portion 101 in the gate wiring 10 of the N− epitaxial layer 7. That is, the contact hole 4a is formed in a size larger than in the first embodiment to enlarge the area of a portion buried in the oxide film 13 on the surface of the contact hole 4a of the gate wiring 10 to enlarge the contact area between the gate wiring 10 and the P+ type layer 3 forming the second gate layer. This construction reduces the contact resistance between the gate wiring 10 and the P+ type layer 3 forming the second gate layer and hence can reduce the ON resistance of the silicon carbide semiconductor device.

(Seventh Embodiment)

Figure 8:
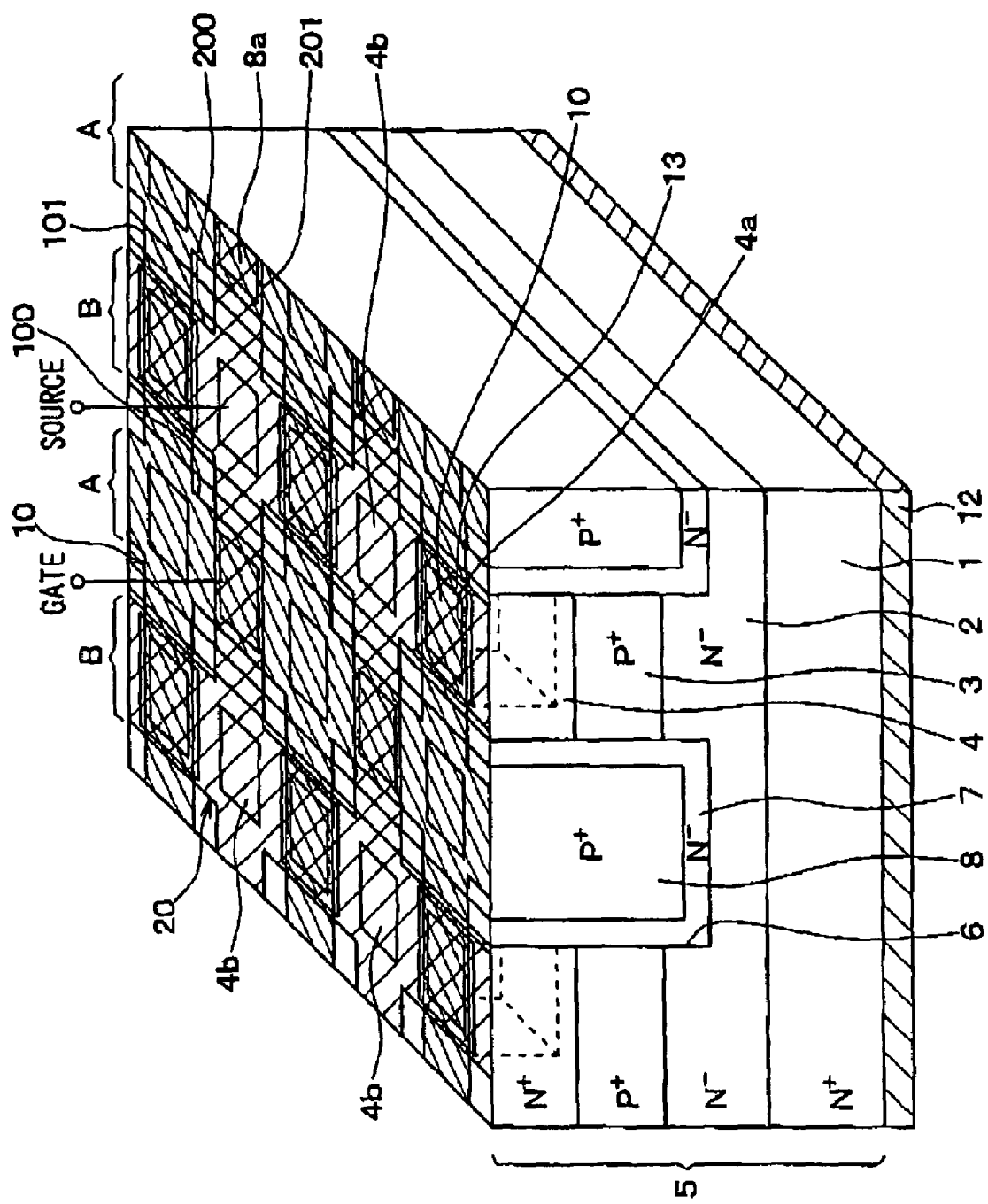
FIG. 8 is a schematic perspective view showing a part of a silicon carbide semiconductor device according to a seventh embodiment of the present invention.

The seventh embodiment of the invention will be described. In FIG. 8 is shown a partial sectional perspective layout of a silicon carbide semiconductor device in this embodiment.

This embodiment adopts a multilayer wiring structure to reduce the size of the cell further than the first embodiment.

To be more specific, the trenches 6 are formed at shorter pitches than in the first embodiment. Further, the contact portion 4b of the source wiring 20 in the N+ type layer 4 forming the source layer and the contact portion 3a of the gate wiring 10 in the P+ type layer 3 forming the second gate layer are arranged in a line between the trenches 6.

The source wiring 20 has a layout in which the portions 200 and the portions 201 are combined in the shape of mesh in such a way that the contact portions 4b of the same line arranged between the trenches 6 are connected to each other and that the contact portions 4b are connected to the contact portions 4b of the neighboring line. Further, the gate wiring 10 also has a layout in which the portions 100 and the portions 101 are combined in the shape of mesh in such a way that the contact portions 8a of the P+ type layer 8 in the same trench 6 are connected to each other and that the contact portions 8a are connected to the contact portions 3a of the P+ type layer 3 in the neighboring line. These source wiring 20 and the gate wiring 10 are constructed as separate layers and are electrically insulated from each other via an interlayer insulation layer (not shown).

In this manner, in the case of adopting the double structure for controlling the P+ type layer 8 and the P+ type layer 3 that become the first and second gate layers at the same electric potential, the cell can be further reduced in size by forming the source wiring 20 and the gate wiring 10 in the multilayer wiring structure.

(Eighth Embodiment)

Figure 9:
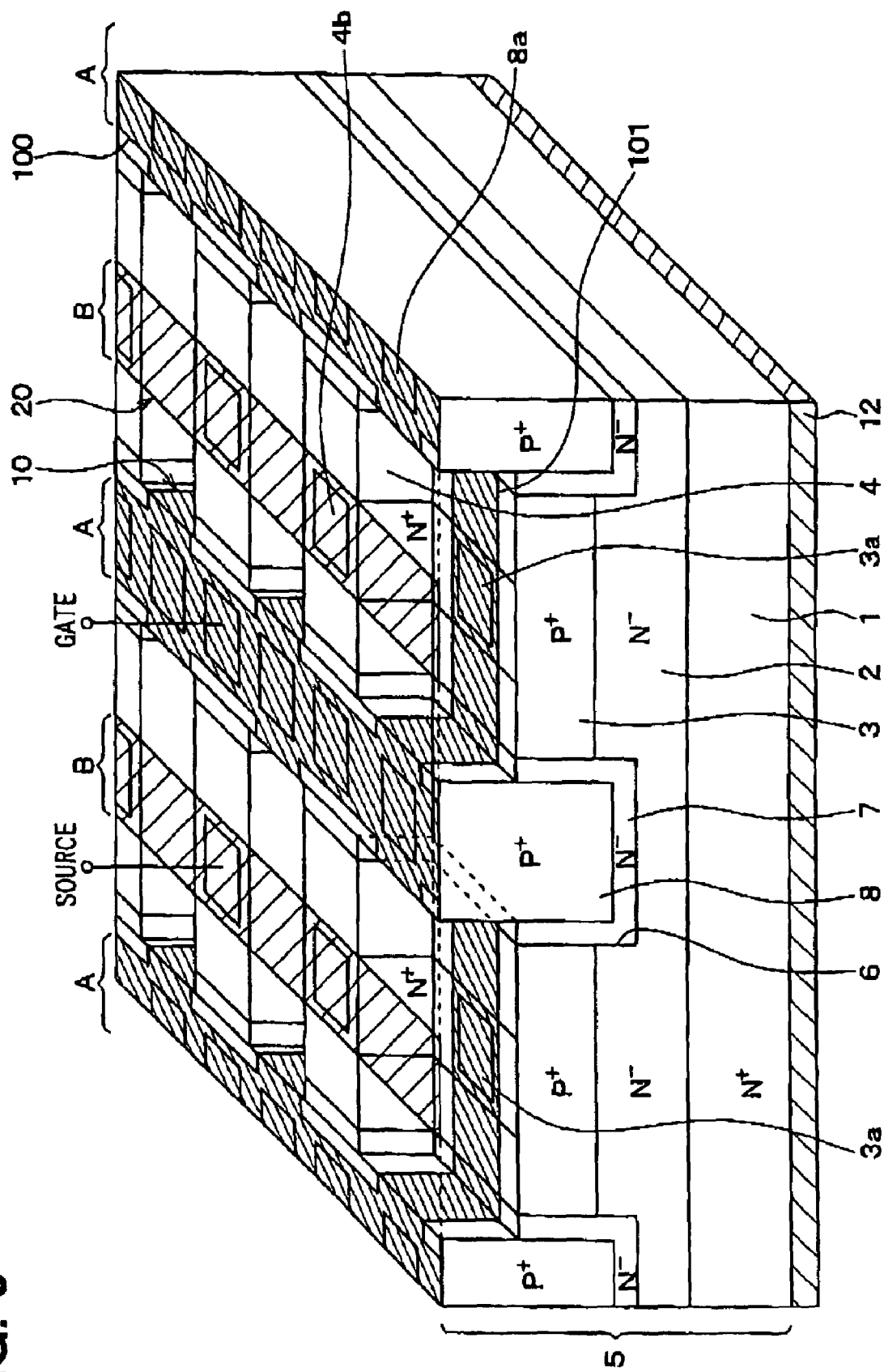
FIG. 9 is a schematic perspective view showing a part of a silicon carbide semiconductor device according to an eighth embodiment of the present invention.

The eighth embodiment of the invention will be described. In FIG. 9 is shown a partial sectional perspective layout of a silicon carbide semiconductor device in this embodiment.

This embodiment also adopts the multilayer wiring structure to reduce the size of the cell further than the first embodiment.

In this embodiment, the electric connection between the P+ type layer 3 forming the second gate layer and the gate wiring 10 and the electric connection between the N+ type layer 3 forming the source layer and the source wiring 20 are changed from those in the first embodiment. The other points are the same as in the first embodiment.

As shown in FIG. 9, in this embodiment, the N+ type layer 4 and the N− type epitaxial layer 7 between the P+ type layers 8 arranged between the neighboring trenches 6 are removed at a portion located at the contact portion 3a electrically connected to the gate wiring 10 of the P+ type layer 3.

As shown in the region A in the drawing, the gate wiring 10 is laid out in the shape of mesh in such a way that the contact portions 8a of the P+ type layer 8 in the same trench 6 are connected to each other and that the contact portions 8a are connected to the contact portions 3a of the P+ type layer 3 in the neighboring line. The gate wiring 10 is arranged on the interlayer insulation film 9 (see FIG. 1) formed over the surface of the semiconductor substrate 5 and is connected to the P+ type layer 3 through the contact portion 3a via the contact hole formed in the interlayer insulation film 9, thereby being connected to the P+ type layer 8 via the contact portion 8a.

Further, as shown in the region B in the drawing, the source wiring 20 is laid out in the shape of stripe in such a way that the contact portions 4b of the N+ type layer 4 sandwiched between the neighboring trenches 6 and forming the source layer are connected to each other. The source wiring 20 is arranged on an interlayer insulation film (not shown) formed over the surface of the gate wiring 10 and is connected to the N+ type layer 4 through the contact portions 4b via the contact holes formed in the interlayer insulation film.

In this manner, in the case of adopting the double gate structure for controlling the P+ type layer 8 and the P+ type layer 3 that become the first and second gate layers at the same electric potential, when the source wiring 20 and the gate wiring 10 are formed in the multilayer wiring structure, the intervals between the trenches 6 can be made narrower than in the first embodiment and hence the cell can be further reduced in size.

(Ninth Embodiment)

Figure 10:
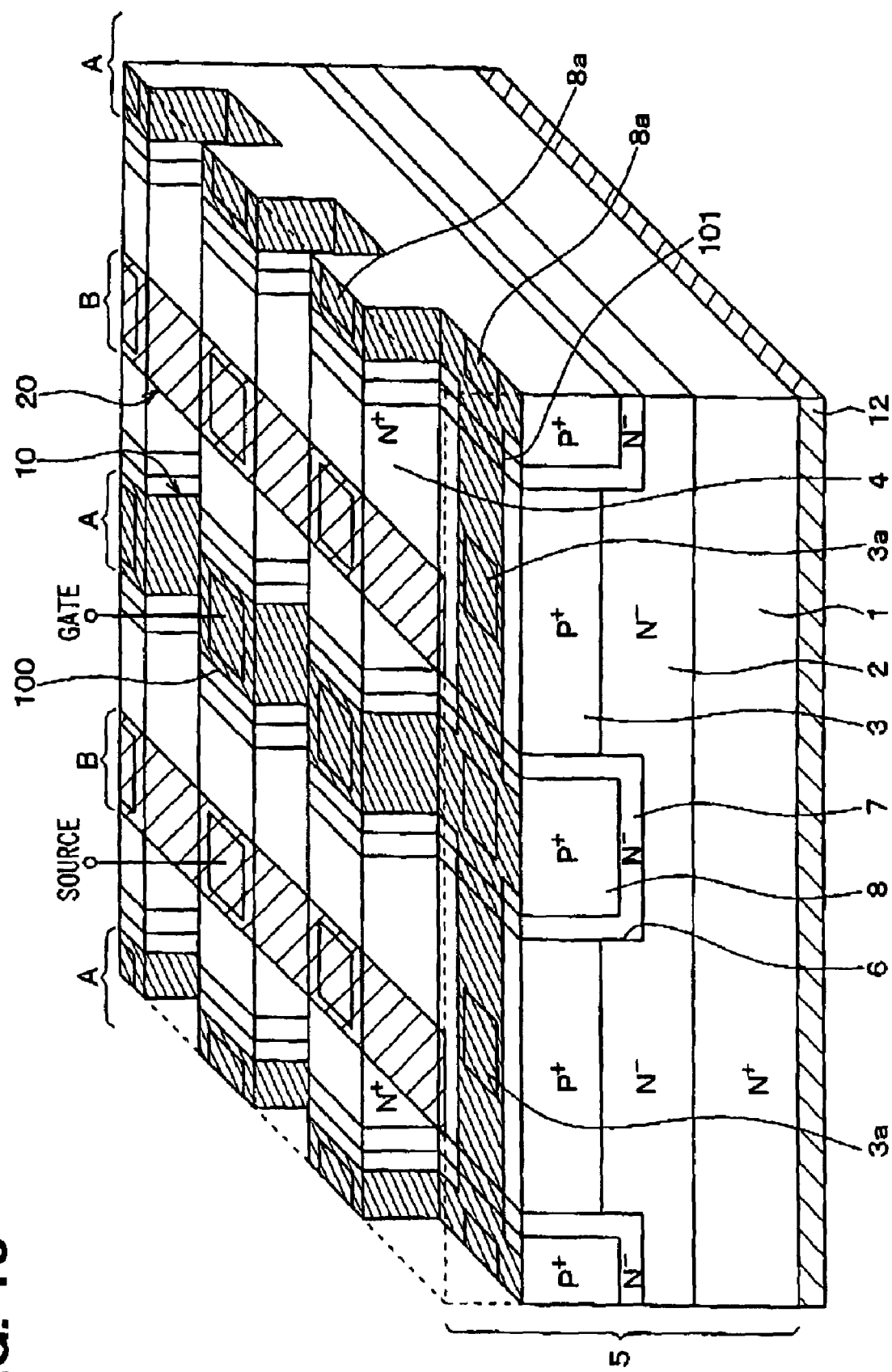
FIG. 10 is a schematic perspective view showing a part of a silicon carbide semiconductor device according to a ninth embodiment of the present invention.

The ninth embodiment of the invention will be described. In FIG. 10 is shown a partial sectional perspective layout of a silicon carbide semiconductor device in this embodiment.

This embodiment also adopts the multilayer wiring structure to reduce the size of the cell further than the first embodiment.

This embodiment is constructed in such a way that trenches are formed perpendicularly to the direction of length of the trenches 6 and the P+ type layer 8 at a portion located at the contact portion 3a of the P+ type layer 3 where the gate wiring 10 is electrically connected to the P+ type layer 3 and that the trenches are depressed as a whole. For this reason, the contact portions 8a of the P+ type layer 8 forming the first gate layer with the gate wiring 10 are so constructed as to be alternately changed in height.

The other construction is the same as in the eighth embodiment and the gate wiring 10 is laid out in the shape of mesh and the source wiring 20 is laid out in the shape of stripe.

In this manner, in the case of adopting the double gate structure for controlling the P+ type layer 8 and the P+ type layer 3 that become the first and second gate layers at the same electric potential, when the source wiring 20 and the gate wiring 10 are formed in the multilayer wiring structure, the intervals between the trenches 6 can be made narrower than in the first embodiment and hence the cell can be further reduced in size.

(Tenth Embodiment)

Figure 11:
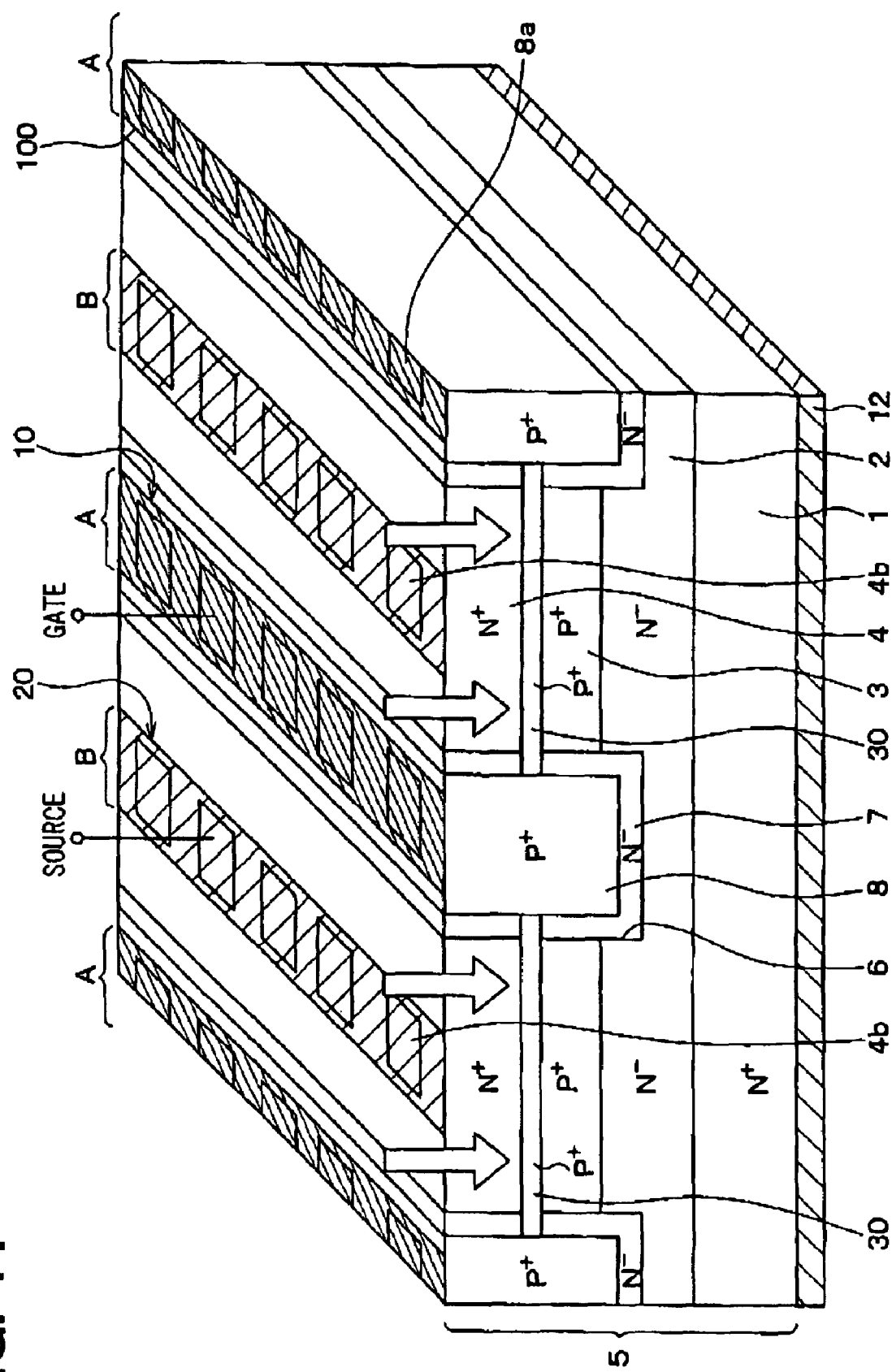
FIG. 11 is a schematic perspective view showing a part of a silicon carbide semiconductor device according to a tenth embodiment of the present invention.

The tenth embodiment of the invention will be described. In FIG. 11 is shown a partial sectional perspective layout of a silicon carbide semiconductor device in this embodiment.

In this embodiment, P type impurities such as B or Al are ion implanted into a portion of the N− type epitaxial layer 7, to be more specific, a portion that is not made a channel region to connect the P+ type layer 8 forming the first gate layer to the P+ type layer 3 forming the second gate layer by a P+ type layer (ion implanted layer) 30.

That is, while the contact portions 4b are arranged in a line in the N+ type layer 4 sandwiched between the neighboring trenches 6, all of the N− type epitaxial layer 7 opposed to the contact portions 4b do not need to be made to function as a channel layer. For this reason, when a portion opposed to the contact portion 4b arranged at a position nearest to the tip in the direction of length of the trench 6 of the N− type epitaxial layer 7 is made to function as the channel layer, a portion opposed to the contact portion 4b adjacent to the portion does not need to be made to function as the channel layer.

Hence, for example, when the N− type epitaxial layer 7 of portions opposed to every other contact portion 4b or every several contact portions 4b are prevented from functioning as the channel layer and P type impurities are ion implanted into the portions, the P+ type layer 8 is connected to the P+ type layer 3 by the P+ type layer 30.

With this construction, as shown in the region A and the region B in the drawing, it is possible to provide a simple layout in the shape of stripe in which the gate wiring 10 and the source wiring 20 are arranged in parallel to the P+ type layer 8 and the N+ type layer 5. Further, even if the multilayer wiring structure is not used, the intervals of the trenches 6 can be made narrower than those in the first embodiment to further reduce the size of the cell.

In this manner, with this construction of this embodiment, in the case of adopting the double gate structure for controlling the P+ type layer 8 and the P+ type layer 3 that become the first and second gate layers at the same electric potential, the cell can be reduced in size.

(Eleventh Embodiment)

Figure 12:
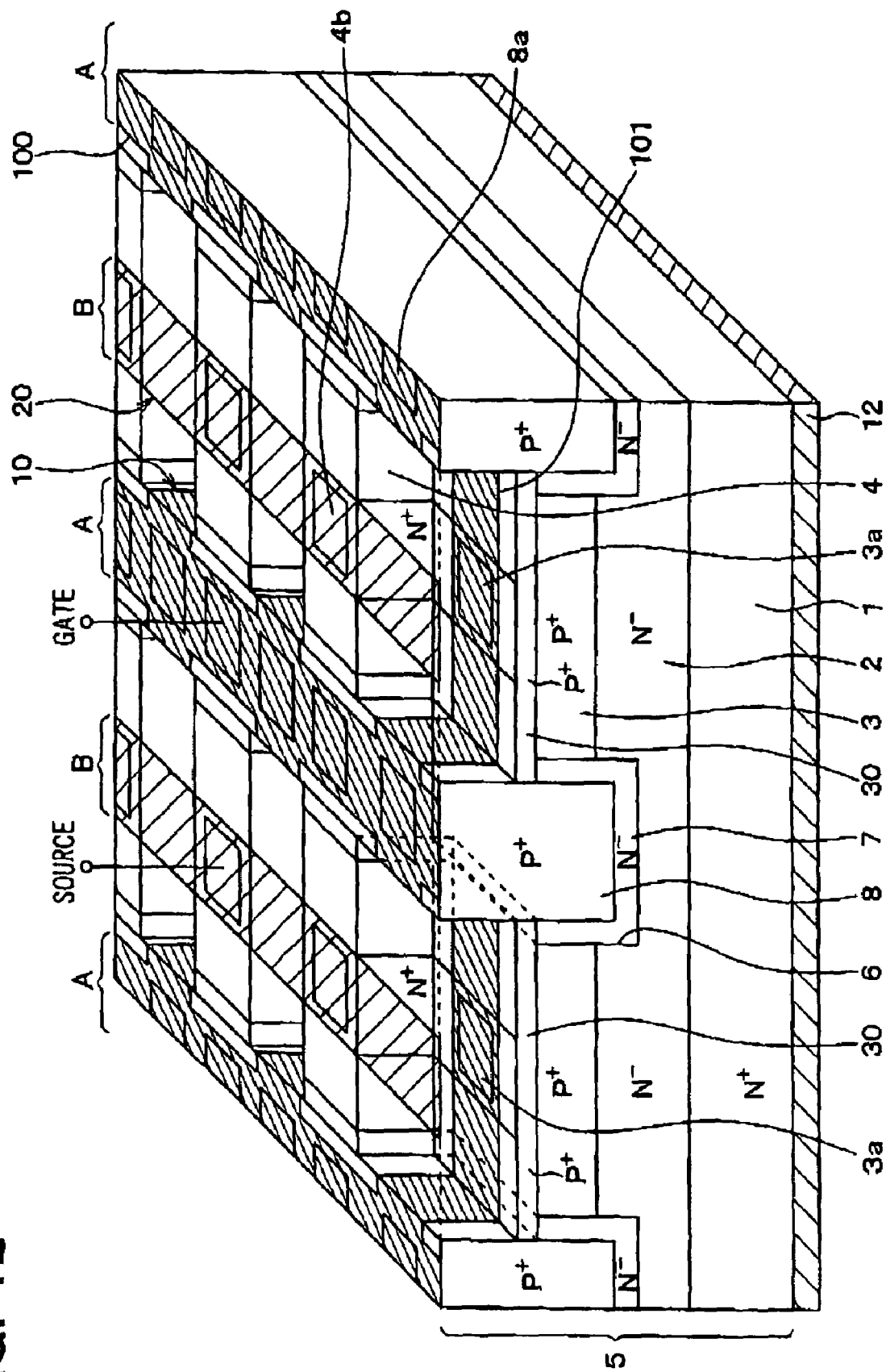
FIG. 12 is a schematic perspective view showing a part of a silicon carbide semiconductor device according to an eleventh embodiment of the present invention.

The eleventh embodiment of the invention will be described. In FIG. 12 is shown a partial sectional perspective layout of a silicon carbide semiconductor device in this embodiment.

In this embodiment, as is the case with the tenth embodiment, in the portion that is not made the channel region of the N− type epitaxial layer 7, the P+ type layer 8 forming the first gate layer is connected to the P+ type layer 3 forming the second gate layer. However, this embodiment is different from the tenth embodiment in that the N− type epitaxial layer 7 and the N+ type layer 4 are not formed above the P+ type layer 30.

That is, in the tenth embodiment, as shown in FIG. 11, ions are implanted into the surfaces of the N− type epitaxial layer 7 and the N+ type layer 4 located above the P+ type layer 3 to form the P+ type layer 30. However, in this embodiment, these layers are removed and then ions are implanted to form the P+ type layer 30. This embodiment is the same in the other points as the tenth embodiment.

The construction of this embodiment can also reduce the size of the cell. According to the manufacturing process of this embodiment, even if ions are not implanted deeply, the P+ type layer 30 can be formed and hence an ion implantation device of high energy is not required to form the P+ type layer 30.

(Twelfth Embodiment)

While a case where the gate wiring 10 is formed in parallel to the P+ type layer 8 and where the source wiring 20 is formed in parallel to the N+ type layer 4 has been described as an example in the tenth embodiment and the eleventh embodiment, the gate wiring 10 and the source wiring 20 do not necessarily need to be formed in parallel. The layout construction in this case will be described with reference to FIG. 13 and FIGS. 14A–14D.

Figure 13:
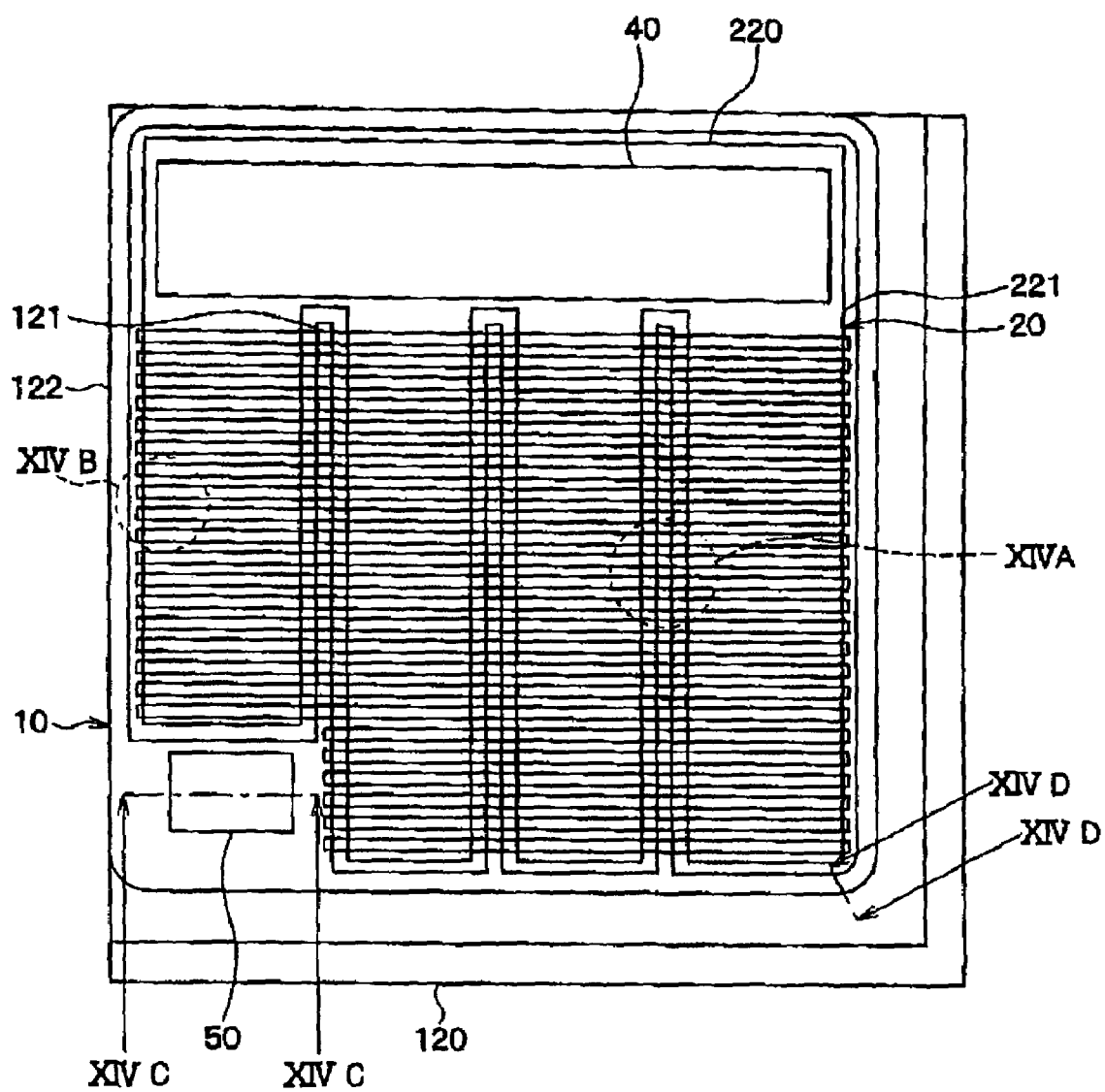
FIG. 13 is a schematic plan view showing a layout of a silicon carbide semiconductor device according to a twelfth embodiment of the present invention.

FIG. 13 shows the whole layout construction of a silicon carbide semiconductor in this embodiment. Further, FIGS. 14A and 14D are partial enlarged views of the regions XIVA, XIVB in FIG. 13, respectively, and FIGS. 14C and 14D correspond to a sectional view taken on a line XIVC—XIVC and a sectional view taken on a line XIVD—XIVD in FIG. 13, respectively.

As shown in FIG. 13, the silicon carbide semiconductor is constructed nearly in the shape of a square and a source pad 40 is arranged on one side and a gate pad 50 to which the P+ type layers 8, 3 that become the first and second gate layers are connected is arranged on one end of the side opposite to the source pad 40.

The source wiring 20 and the gate wiring 10 constructed of a Ni film and an alloy layer made of Ni and Al are formed below the source pad 40 and the gate pad 50 via the interlayer insulation film 9 (see FIG. 14C).

The source wiring 20 is constructed of a portion 220 extended to nearly the whole region below the source pad 40 and four lines 221 extended from the portion 220 perpendicularly to the direction of length of the source pad 40.

In the cell part, as shown in FIG. 14A, the contact portions 4b of the N+ type layer 4 forming the source layer are formed between the trenches 6 perpendicularly to the direction of length of the respective lines 221 in this source wiring 20.

In other words, in the portions to become this contact portions 4b, contact holes are formed in the interlayer insulation film 9 (see FIG. 14C), whereby the source wiring 20 is electrically connected to the N⁺ type layer 4.

Further, the gate wiring 10 is constructed of a portion 120 extended to nearly the whole region below the gate pad 50, three inner lines 121 extended between four lines 221, and an outer peripheral line 122 constructed in such a way as to surround the periphery of the source wiring 20.

In the cell part, as shown in FIG. 14A, the P⁺ type layer 30 is formed by ion implantation in such a way as to overlap the respective inner lines 121 below the respective inner lines 121 in this gate wiring 10. The center line of this P⁺ type layer 30 is made a contact portion 30a. In other words, in the portion to be made this contact portion 30a, a contact hole is formed in the interlayer insulation film 9 and the gate wiring 10 is electrically connected to the P⁺ type layer 30. In this manner, the gate wiring 10 is electrically connected the P⁺ type layers 8, 3 that form the gate wirings.

Figure 14B:
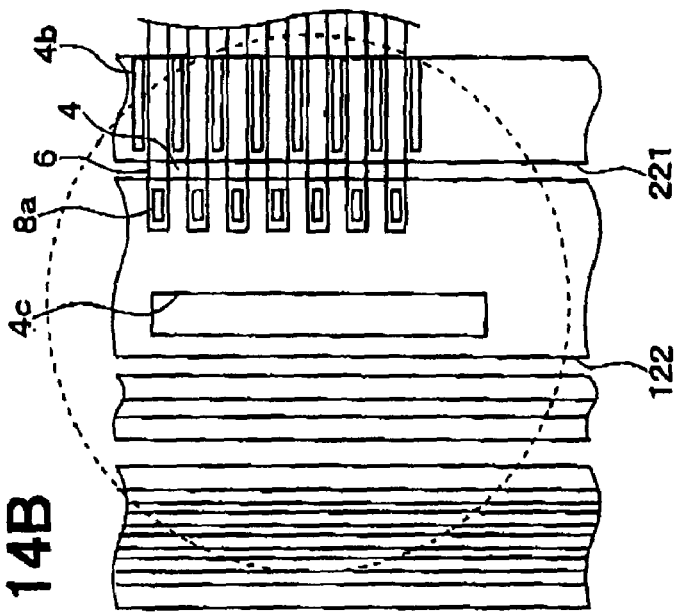
FIG. 14B is a partially enlarged plan view showing a part XIVB in FIG. 13.
Figure 14D:
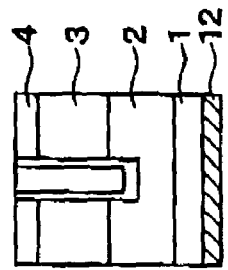
FIG. 14D is a partially enlarged cross sectional view showing a part of the device taken along line XIVD—XIVD in FIG. 13.
Figure 14A:
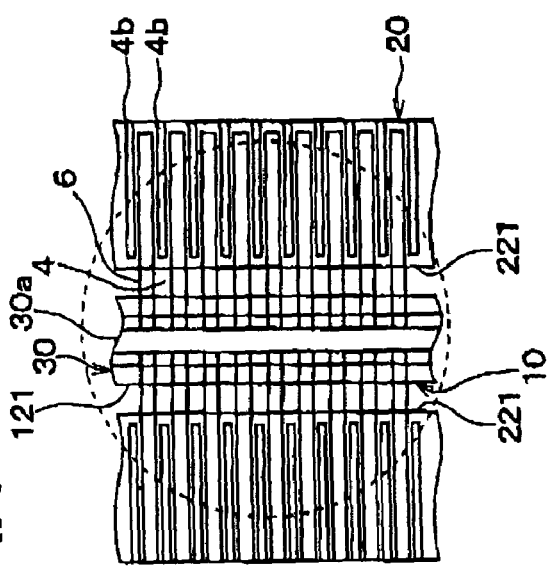
FIG. 14A is a partially enlarged plan view showing a part XIVA in FIG. 13.

On the other hand, in the outer peripheral region, as shown in FIG. 14B, the trench 6 is laid out in such a way as to overlap the outer peripheral line 122 in the gate wiring 10. Contact holes are formed in the interlayer insulation film 9 in this tip position and the P⁺ type layer 8 forming the first gate layer is connected to the outer peripheral line 122 at the contact portions 8a. Further, a trench 4c is formed in the N⁺ type layer 4 at a position overlapping the region located closer to the outer periphery of the cell part than the trench 6 of the outer peripheral line 122 and the outer peripheral line 122 is connected to the P⁺ type layer 3 forming the second gate layer through this trench 4c.

Figure 14C:
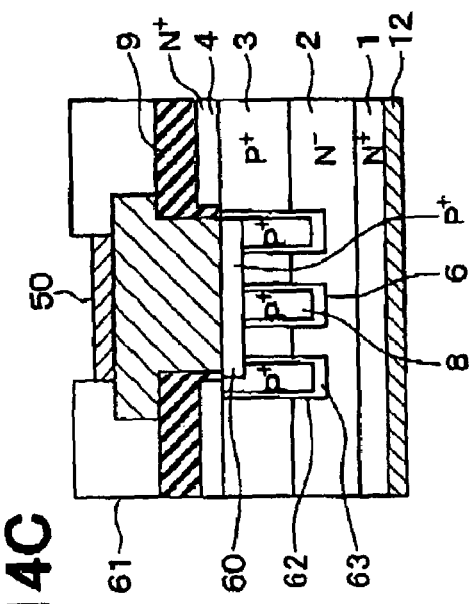
FIG. 14C is a partially enlarged cross sectional view showing a part of the device taken along line XIVC—XIVC in FIG. 13.

Further, as shown in FIG. 14C, the gate pad 50 is formed in the opening of a protection film 61 formed over the surface of the interlayer insulation film 9 including the gate wiring 10. In the region where this gate pad 50 is formed, the trench 6 is extended from the cell part and the P⁺ type layer 8 is formed therein just as with the cell part. Below the gate pad 50, the N⁺ type layer 4 is removed and a contact portion 60 formed by ion implantation is formed on the surface portions of the P⁺ type layer 3 and the P⁺ type layer 8, whereby the P⁺ type layer 3 and the P⁺ type layer 8 are electrically connected to the gate wiring 10.

In this regard, in the outer peripheral region, a trench 62 formed by the same process as the trench 6 is formed in such a way as to surround the cell part and this trench 62 and the N⁻ type epitaxial layer 63 formed on the inner wall surface of the trench 62 realizes insulating separation.

As described above, this embodiment has a layout construction in which the gate wiring 10 is formed perpendicularly to the P⁺ type layer 8 and in which the source wiring 20 is formed perpendicularly to the N⁺ type layer 4. This construction can produce the same effect as the first embodiment.

(Thirteenth Embodiment)

In the twelfth embodiment, one example of layout of the silicon carbide semiconductor device of the double gate structure for controlling the first gate layer and the second gate layer at the same electric potential has been described. However, in this embodiment, a double gate structure is capable of controlling the electric potential of the first gate layer independently from the electric potential of the second gate layer.

Figure 15:
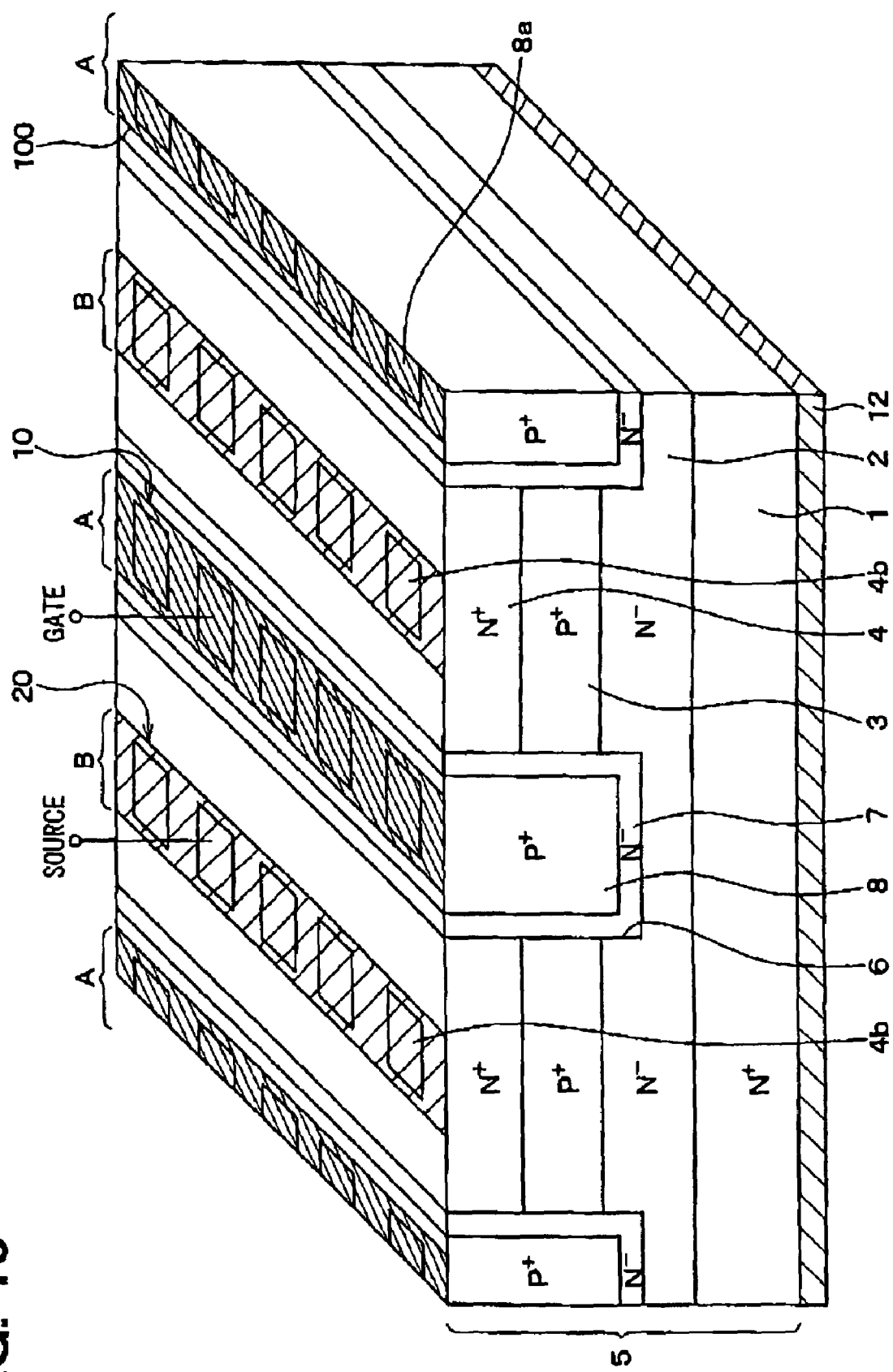
FIG. 15 is a schematic perspective view showing a part of a silicon carbide semiconductor device according to a thirteenth embodiment of the present invention.

In FIG. 15 is shown a partial sectional perspective view of the silicon carbide semiconductor device in this embodiment. As shown in this drawing, only the gate wiring 10 (region A) connected to the P⁺ type layer 8 forming the first gate layer and the source wiring 20 (region B) connected to the N⁺ type layer 4 forming the source layer are formed in the cell part. In the silicon carbide semiconductor device of this construction, a gate pad (second gate pad) for the second gate layer is formed at a position separate from the cell part.

Figure 16:
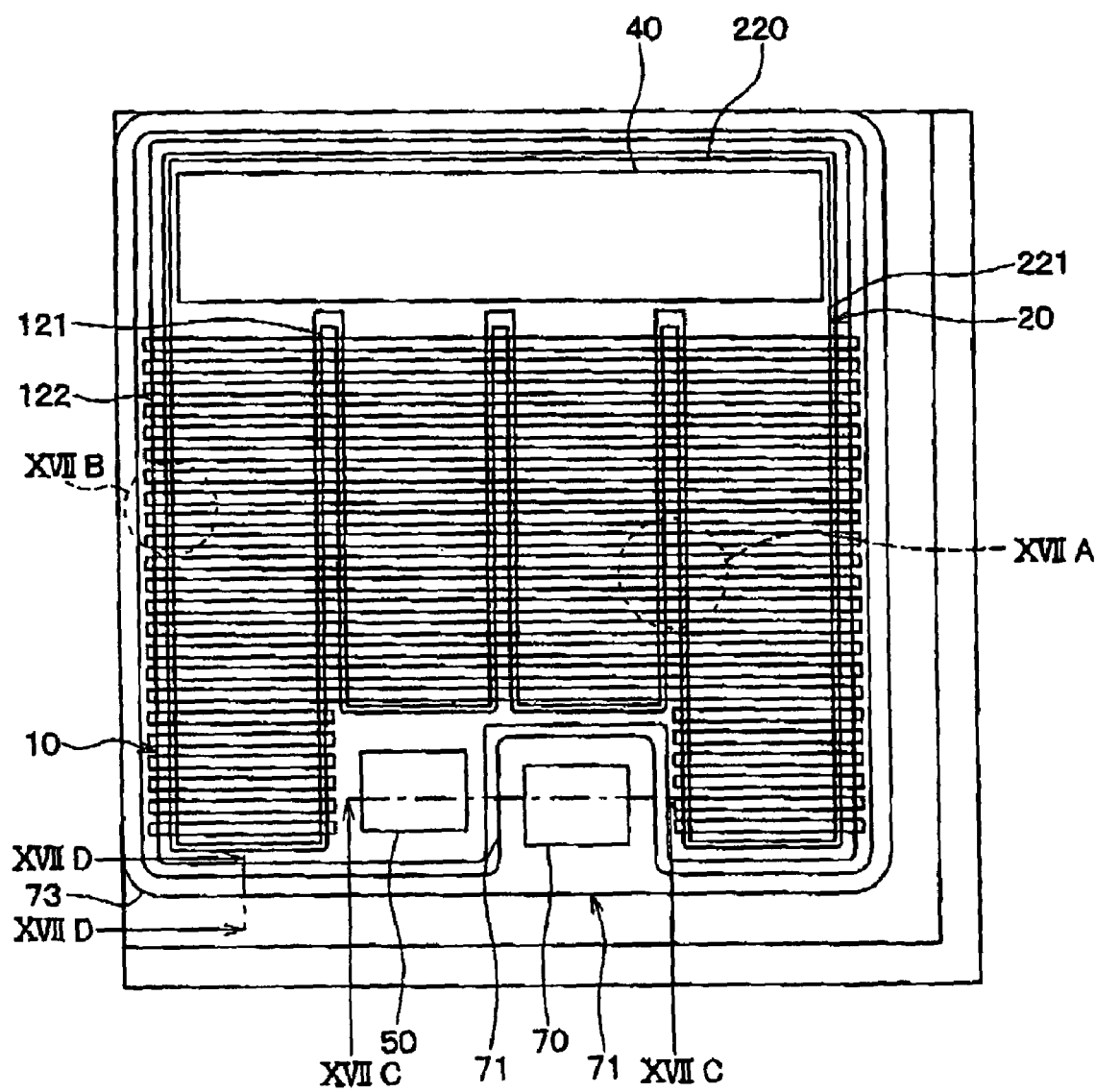
FIG. 16 is a schematic plan view showing a layout of the device according to the thirteenth embodiment.
Figure 18:
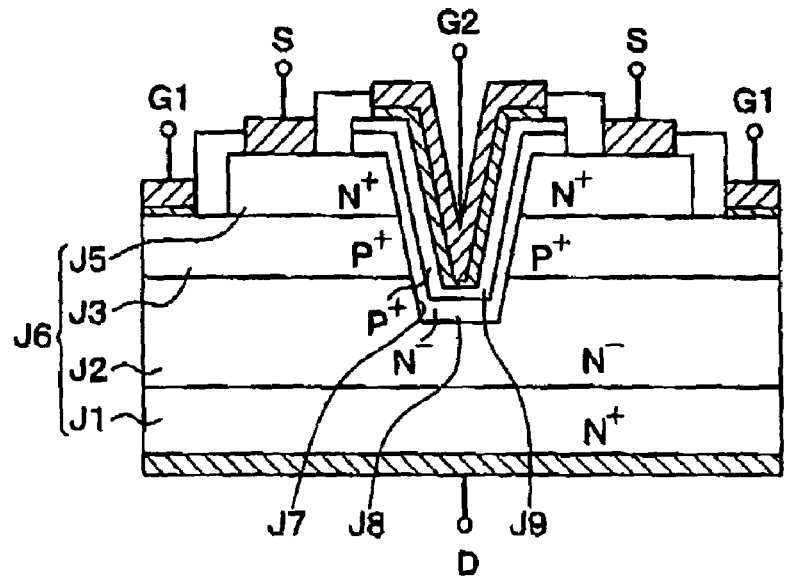
FIG. 18 is a cross sectional view showing a part of a silicon carbide semiconductor device according to a prior art.
Figure 19:
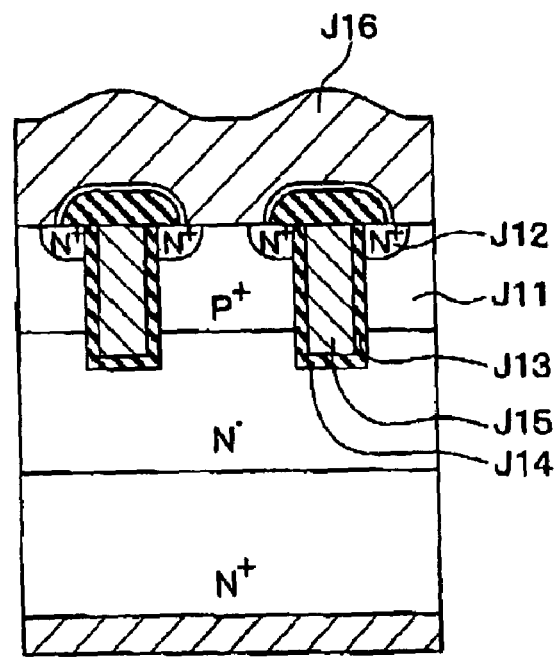
FIG. 19 is a cross sectional view showing a part of a silicon carbide semiconductor device according to another prior art.

In FIG. 16 is shown the general layout construction of the silicon carbide semiconductor device in this embodiment. Further, partial enlarged views of regions XVIIA, XVIIB in FIG. 16 are shown in FIGS. 17A, 17B, and sectional views taken on a line XVIIC—XVIIC and a line XVIID—XVIID in FIG. 16 are shown in FIGS. 17C, 17D. Hereafter, the construction of the silicon carbide semiconductor device in this embodiment will be described based on these drawings. However, this embodiment has nearly the same construction as the twelfth embodiment, so that descriptions will be given on the different portions between the embodiments.

As shown in FIG. 16, in this embodiment, a gate pad 50 to which the P⁺ type layer 8 forming the first gate layer is connected and a gate pad 70 to which the P⁺ type layer 3 forming the second gate layer is connected are arranged in such a way as to be adjacent to each other at the positions of the tips of two lines arranged inside the inner lines 221 in the source wiring 20.

The gate wiring 10 constructed of the Ni film and the alloy layer made of Ni and Al is formed below the gate pad 50 via the interlayer insulation film 9 (see FIGS. 17C, 17D). This embodiment is constructed in the same manner as the twelfth embodiment except that this gate wiring 10 is electrically separated from the gate pad 70 and is not connected to the P⁺ type layer 3.

Further, a gate wiring 71 is formed below the gate pad 70 via the interlayer insulation film 9. This gate wiring 71 is constructed of a portion extended over the whole region below the gate pad 70 and an outer peripheral line 73 constructed in such a way as to surround the outer peripheral line 122 in the gate wiring 10.

The gate wiring 10 is connected to the P⁺ type layer 8 forming the first gate layer in the cell part. To be more specific, as shown in FIG. 17A, a region overlapping the inner line 121 in the gate wiring 10 of the P⁺ type layer 8 in each trench 6 is made the contact portion 8a. In other words, at the position that is made this contact portion 8a, a contact hole is formed in the interlayer insulation film 9 and the gate wiring 10 is electrically connected to the P⁺ type layer 8.

In this manner, this embodiment has the above-described construction in the double gate structure capable of controlling the electric potential of the first gate layer independently of the electric potential of the second gate layer. This construction can also produce the same effect as the first embodiment.

(Other Embodiment)

In the above embodiments, the descriptions on the silicon carbide semiconductor device have been provided in which the first conduction type and the second conduction type are the N type and the P type, respectively. However, the invention can be applied to a silicon carbide semiconductor device in which these conduction types are reversed.

Such changes and modifications are to be understood as being within the scope of the present invention as defined by the appended claims.

What is claimed is:

1. A silicon carbide semiconductor device comprising:
a semiconductor substrate including first and second gate layers, a channel layer, a source layer, and a trench;
a gate wiring having a first portion and a plurality of second portions; and
a source wiring having a third portion and a plurality of fourth portions, wherein the source layer is disposed on the second gate layer,
wherein the trench penetrates both of the source layer and the second gate layer, and extends in a predetermined extending direction on a principal surface of the semiconductor substrate,
wherein the first gate layer is disposed in the trench through the channel layer, and
extends in parallel to the extending direction,
wherein the gate and source wirings are disposed on the principal surface of the semiconductor substrate,
wherein the first portion is disposed on and electrically connects to the first gate layer, and extends in parallel to the extending direction,
wherein the second portions protrude perpendicularly to the extending direction from a side of the first portion to be a comb shape,
wherein the third portion is disposed on the source layer, and extends in parallel to the extending direction,
wherein the fourth portions protrude perpendicularly to the extending direction from a side of the third portion to be a comb shape, and electrically connect to the source layer,
wherein the second portions and the fourth portions are disposed alternately to face each other, and
wherein each of the second portions connects to the second gate layer through a contact hole disposed in the source layer.

2. The device according to claim 1, further comprising:
a drain electrode,
wherein the semiconductor substrate further includes a substrate and a first semiconductor layer,
wherein the drain electrode is disposed on a bottom surface of the substrate, which is opposite to the principal surface of the semiconductor substrate,
wherein the substrate, the first semiconductor layer, the second gate layer, and the source layer are laminated in this order,
wherein the semiconductor substrate has a first conductive type and is made of silicon carbide,
wherein the first semiconductor layer has the first conductive type and is made of silicon carbide with an impurity concentration lower than the substrate,
wherein second gate layer has a second conductive type and is made of silicon carbide,
wherein the source layer has the first conductive type and is made of silicon carbide,
wherein the trench reaches the first semiconductor layer through the source layer and the second gate layer,
wherein the channel layer has the first conductive type and is disposed on an inner wall of the trench, and
wherein the first gate layer has the second conductive type and is disposed in the trench through the channel layer.

3. The device according to claim 2,
wherein a part of the second portion is disposed in the contact hole through an insulation film, and
wherein the contact hole is disposed under the second portion.

4. The device according to claim 3,
wherein the insulation film in the contact hole contacts the first gate layer so that a cross section of the second portion in the contact hole becomes larger.

5. A silicon carbide semiconductor device comprising:
a semiconductor substrate including first and second gate layers, a channel layer, a source layer, and a trench;
a gate wiring having a plurality of first portions and a plurality of second portions; and
a source wiring having a plurality of third portions and a plurality of fourth portions,
wherein the source layer is disposed on the second gate layer,
wherein the trench penetrates both of the source layer and the second gate layer, and extends in a predetermined extending direction on a principal surface of the semiconductor substrate,
wherein the first gate layer is disposed in the trench through the channel layer, and extends in parallel to the extending direction,
wherein the gate and source wirings are disposed on the principal surface of the semiconductor substrate,
wherein the first portions are disposed on and electrically connect to the first gate layer, and extend in parallel to the extending direction,
wherein the second portions protrude perpendicularly to the extending direction from both sides of the first portions to be a mesh shape,
wherein the third portions are disposed on the source layer, and extend in parallel to the extending direction,
wherein the fourth portions protrude perpendicularly to the extending direction from both sides of the third portions to be a mesh shape, and electrically connect to the source layer,
wherein the first portions and the third portions are disposed alternately to face each other,
wherein the second portions and the fourth portions are disposed alternately to face each other, and
wherein each of the second portions connects to the second gate layer through a contact hole disposed in the source layer.

6. The device according to claim 5, further comprising:
a drain electrode,
wherein the semiconductor substrate further includes a substrate and a first semiconductor layer,
wherein the drain electrode is disposed on a bottom surface of the substrate, which is opposite to the principal surface of the semiconductor substrate,
wherein the substrate, the first semiconductor layer, the second gate layer, and the source layer are laminated in this order,
wherein the semiconductor substrate has a first conductive type and is made of silicon carbide,
wherein the first semiconductor layer has the first conductive type and is made of silicon carbide with an impurity concentration lower than the substrate,
wherein second gate layer has a second conductive type and is made of silicon carbide,
wherein the source layer has the first conductive type and is made of silicon carbide,
wherein the trench reaches the first semiconductor layer through the source layer and the second gate layer,
wherein the channel layer has the first conductive type and is disposed on an inner wall of the trench, and
wherein the first gate layer has the second conductive type and is disposed in the trench through the channel layer.

7. The device according to claim 5,
wherein a part of the second portion is disposed in the contact hole through an insulation film, and
wherein the contact hole is disposed under the second portion.

8. A silicon carbide semiconductor device comprising:
a semiconductor substrate including first and second gate layers, a channel layer, a source layer, and a trench;

a gate wiring having a first portion and a plurality of second portions; and a source wiring, wherein the source layer is disposed on the second gate layer, wherein the trench penetrates both of the source layer and the second gate layer, and extends in a predetermined extending direction on a principal surface of the semiconductor substrate, wherein the first gate layer is disposed in the trench through the channel layer, and extends in parallel to the extending direction, wherein the gate and source wirings are disposed on the principal surface of the semiconductor substrate, wherein the first portion is disposed on and electrically connects to the first gate layer, and extends in parallel to the extending direction, wherein the second portions protrude perpendicularly to the extending direction from a side of the first portion to be a comb shape, wherein the source wiring is disposed on the source layer, extends in parallel to the extending direction, and electrically connects to the source layer, wherein the semiconductor substrate further includes a concavity, which is disposed under the second portions to expose a surface of the second gate layer, and wherein each of the second portions connects to the second gate layer exposed on a bottom of the concavity.

9. The device according to claim 8, further comprising:
a drain electrode, wherein the semiconductor substrate further includes a substrate and a first semiconductor layer, wherein the drain electrode is disposed on a bottom surface of the substrate, which is opposite to the principal surface of the semiconductor substrate, wherein the substrate, the first semiconductor layer, the second gate layer, and the source layer are laminated in this order, wherein the semiconductor substrate has a first conductive type and is made of silicon carbide, wherein the first semiconductor layer has the first conductive type and is made of silicon carbide with an impurity concentration lower than the substrate, wherein second gate layer has a second conductive type and is made of silicon carbide, wherein the source layer has the first conductive type and is made of silicon carbide, wherein the trench reaches the first semiconductor layer through the source layer and the second gate layer, wherein the channel layer has the first conductive type and is disposed on an inner wall of the trench, and wherein the first gate layer has the second conductive type and is disposed in the trench through the channel layer.

10. A silicon carbide semiconductor device comprising:
a semiconductor substrate including first and second gate layers, a channel layer, a source layer, and a trench;
a gate wiring having a first portion and a plurality of second portions; and
a source wiring, wherein the source layer is disposed on the second gate layer, wherein the trench penetrates both of the source layer and the second gate layer, and extends in a predetermined extending direction on a principal surface of the semiconductor substrate, wherein the first gate layer is disposed in the trench through the channel layer, and extends in parallel to the extending direction, wherein the gate and source wirings are disposed on the principal surface of the semiconductor substrate, wherein the first portion is disposed on and electrically connects to the first gate layer, and extends in parallel to the extending direction, wherein the second portions protrude perpendicularly to the extending direction from a side of the first portion to be a comb shape, wherein the source wiring is disposed on the source layer, extends in parallel to the extending direction, and electrically connects to the source layer, wherein the semiconductor substrate further includes a concavity, which is disposed under the second portions and a part of the first portion to expose a surface of the second gate layer, wherein the part of the first portion is disposed at a cross portion between two second portions, which are disposed on both sides of the first portion, and wherein each of the second portions connects to the second gate layer exposed on a bottom of the concavity.

11. The device according to claim 10, further comprising:
a drain electrode, wherein the semiconductor substrate further includes a substrate and a first semiconductor layer, wherein the drain electrode is disposed on a bottom surface of the substrate, which is opposite to the principal surface of the semiconductor substrate, wherein the substrate, the first semiconductor layer, the second gate layer, and the source layer are laminated in this order, wherein the semiconductor substrate has a first conductive type and is made of silicon carbide, wherein the first semiconductor layer has the first conductive type and is made of silicon carbide with an impurity concentration lower than the substrate, wherein second gate layer has a second conductive type and is made of silicon carbide, wherein the source layer has the first conductive type and is made of silicon carbide, wherein the trench reaches the first semiconductor layer through the source layer and the second gate layer, wherein the channel layer has the first conductive type and is disposed on an inner wall of the trench, and wherein the first gate layer has the second conductive type and is disposed in the trench through the channel layer.

12. A silicon carbide semiconductor device comprising:
a semiconductor substrate including first and second gate layers, a channel layer, a source layer, an interlayer, and a trench;
a gate wiring; and
a source wiring, wherein the source layer, the interlayer and the second gate layer are laminated in this order, wherein the trench penetrates both of the source layer, the interlayer and the second gate layer, and extends in a predetermined extending direction on a principal surface of the semiconductor substrate, wherein the first gate layer is disposed in the trench through the channel layer, and extends in parallel to the extending direction, wherein the gate and source wirings are disposed on the principal surface of the semiconductor substrate, wherein the gate wiring is disposed on and electrically connects to the first gate layer, and extends in parallel to the extending direction, wherein the source wiring is disposed on the source layer, extends in parallel to the extending direction, and electrically connects to the source layer, and wherein the interlayer connects between the first and second gate layers electrically.

13. The device according to claim 12, further comprising:

a drain electrode, wherein the semiconductor substrate further includes a substrate and a first semiconductor layer, wherein the drain electrode is disposed on a bottom surface of the substrate, which is opposite to the principal surface of the semiconductor substrate, wherein the substrate, the first semiconductor layer, the second gate layer, the interlayer and the source layer are laminated in this order, wherein the semiconductor substrate has a first conductive type and is made of silicon carbide, wherein the first semiconductor layer has the first conductive type and is made of silicon carbide with an impurity concentration lower than the substrate, wherein second gate layer has a second conductive type and is made of silicon carbide, wherein the interlayer has the second conductive type and is made of an ion implantation layer, wherein the source layer has the first conductive type and is made of silicon carbide, wherein the trench reaches the first semiconductor layer through the source layer, the interlayer and the second gate layer, wherein the channel layer has the first conductive type and is disposed on an inner wall of the trench, and wherein the first gate layer has the second conductive type and is disposed in the trench through the channel layer.

14. The device according to claim 13, wherein the gate wiring includes a first portion and a plurality of second portions, wherein the first portion is disposed on and electrically connects to the first gate layer, and extends in parallel to the extending direction, wherein the second portions protrude perpendicularly to the extending direction from a side of the first portion to be a comb shape, wherein the semiconductor substrate further includes a concavity, which is disposed under the second portions to expose a surface of the interlayer, and wherein each of the second portions connects to the second gate layer through the interlayer exposed on a bottom of the concavity.

* * * * *